(12) United States Patent
Orsley et al.

(10) Patent No.: US 8,232,963 B2
(45) Date of Patent: Jul. 31, 2012

(54) CONTROL AND DATA ENTRY APPARATUS

(75) Inventors: Timothy James Orsley, San Jose, CA (US); Azin Sahabi, Palo Alto, CA (US)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 1085 days.

(21) Appl. No.: 11/923,653

(22) Filed: Oct. 25, 2007

(65) Prior Publication Data
US 2009/0057124 A1    Mar. 5, 2009

Related U.S. Application Data

(60) Provisional application No. 60/966,308, filed on Aug. 27, 2007.

(51) Int. Cl.
*G09F 3/033* (2006.01)
(52) U.S. Cl. ......................................................... 345/157
(58) Field of Classification Search .................. 345/169, 345/173, 175, 157
See application file for complete search history.

(56) References Cited

U.S. PATENT DOCUMENTS

| | | | |
|---|---|---|---|
| 3,700,905 A | 10/1972 | Parkin et al. |
| 3,973,270 A | 8/1976 | Schroder et al. |
| 3,987,685 A | 10/1976 | Opocensky |
| 4,670,743 A | 6/1987 | Zemke |
| 4,719,455 A | 1/1988 | Louis |
| 5,006,952 A | 4/1991 | Thomas |
| 5,056,146 A | 10/1991 | Nishide |
| 5,086,296 A | 2/1992 | Clark |
| 5,134,887 A | 8/1992 | Bell |
| 5,191,971 A | 3/1993 | Hakkarainen et al. |
| 5,252,952 A | 10/1993 | Frank et al. |
| 5,263,134 A | 11/1993 | Paal et al. |
| 5,305,017 A | 4/1994 | Gerpheide |
| 5,343,765 A | 9/1994 | Okada |
| 5,421,694 A | 6/1995 | Baker et al. |
| 5,504,502 A | 4/1996 | Arita et al. |
| 5,515,044 A | 5/1996 | Glatt |
| 5,615,083 A | 3/1997 | Barnett |

(Continued)

FOREIGN PATENT DOCUMENTS

DE    4033465    5/1991

(Continued)

OTHER PUBLICATIONS

U.S. Appl. No. 11/606,556, filed Nov. 30, 2007, Harley et al.

(Continued)

*Primary Examiner* — Quan-Zhen Wang
*Assistant Examiner* — Tony Davis

(57) ABSTRACT

A control and data entry device adapted for use in for electronic devices such as portable computers, PDA's, cell phones, MP3 players and the like. The control and data entry device includes a tiltable member or similar structure carrying an electrically conductive member spaced from multiple sense electrodes disposed on a circuit substrate. In one embodiment, capacitances between the electrically conductive member and the electrodes are measured to provide information concerning the tiltable member's orientation relative to the sense electrodes. The tiltable member may be manipulated by a users finger to tilt such member slightly and thereby effect scrolling functionality, thereby simulating the operation of circular capacitive touch pads known in the art. Switches may also be included, responsive to greater tilting of the tiltable member, thereby to effect clicking functionality. In some embodiments, a rotatable knob may be used to effect scrolling functionality.

23 Claims, 10 Drawing Sheets

U.S. PATENT DOCUMENTS

| | | |
|---|---|---|
| 5,659,334 A | 8/1997 | Yaniger et al. |
| 5,703,356 A | 12/1997 | Bidiville et al. |
| 5,704,037 A | 12/1997 | Chen |
| 5,739,821 A | 4/1998 | Ho et al. |
| 5,808,603 A | 9/1998 | Chen |
| 5,815,139 A | 9/1998 | Yoshikawa et al. |
| 5,874,956 A | 2/1999 | LaHood |
| 5,883,690 A | 3/1999 | Meyers et al. |
| 5,889,507 A | 3/1999 | Engle et al. |
| 5,914,465 A | 6/1999 | Allen |
| 5,949,354 A | 9/1999 | Chang |
| 5,956,016 A | 9/1999 | Kuenzner et al. |
| 6,115,030 A | 9/2000 | Berstin et al. |
| 6,198,473 B1 | 3/2001 | Armstrong |
| 6,208,328 B1 | 3/2001 | Kawachiya et al. |
| 6,256,012 B1 | 7/2001 | Devolpi |
| 6,288,707 B1 | 9/2001 | Philipp |
| 6,292,174 B1 | 9/2001 | Mallett et al. |
| 6,326,948 B1 | 12/2001 | Kobachi et al. |
| 6,430,023 B1 | 8/2002 | Suzuki |
| 6,489,950 B1 | 12/2002 | Griffin et al. |
| 6,492,911 B1 | 12/2002 | Netzer |
| 6,525,713 B1 | 2/2003 | Soeta et al. |
| 6,530,283 B2 | 3/2003 | Okada et al. |
| 6,646,631 B2 | 11/2003 | Suzuki et al. |
| 6,667,733 B2 | 12/2003 | Miyoshi |
| 6,730,863 B1 | 5/2004 | Gerpheide et al. |
| 6,753,848 B2 | 6/2004 | Toshiharu |
| 6,762,748 B2 | 7/2004 | Maatta et al. |
| 6,816,148 B2 | 11/2004 | Mallett et al. |
| 6,816,154 B2 | 11/2004 | Wong et al. |
| 6,961,052 B1 | 11/2005 | Vaziri |
| 7,019,765 B2 | 3/2006 | Fujiwara et al. |
| 7,042,441 B2 | 5/2006 | Adams et al. |
| 7,046,230 B2 | 5/2006 | Zadesky et al. |
| 7,123,028 B2 | 10/2006 | Okada et al. |
| 7,158,115 B2 | 1/2007 | Harley et al. |
| 7,429,976 B2 | 9/2008 | Harley |
| 7,639,234 B2 | 12/2009 | Orsley |
| 7,733,333 B2 | 6/2010 | Kaliher |
| 7,889,176 B2 | 2/2011 | Harley et al. |
| 2002/0093328 A1 | 7/2002 | Maatta et al. |
| 2002/0163547 A1 | 11/2002 | Abramson et al. |
| 2003/0025679 A1* | 2/2003 | Taylor et al. ............ 345/175 |
| 2003/0048250 A1 | 3/2003 | Boon et al. |
| 2003/0048262 A1 | 3/2003 | Wu et al. |
| 2003/0076301 A1 | 4/2003 | Tsuk et al. |
| 2003/0076306 A1 | 4/2003 | Zadesky et al. |
| 2003/0095096 A1 | 5/2003 | Robbin et al. |
| 2004/0108993 A1 | 6/2004 | Suzuki et al. |
| 2005/0052425 A1 | 3/2005 | Zadesky et al. |
| 2005/0052426 A1 | 3/2005 | Hagermoser et al. |
| 2005/0052429 A1 | 3/2005 | Philipp |
| 2005/0062732 A1 | 3/2005 | Sinclair et al. |
| 2005/0110755 A1 | 5/2005 | Harley et al. |
| 2006/0001657 A1 | 1/2006 | Monney et al. |
| 2006/0016800 A1 | 1/2006 | Paradiso et al. |
| 2006/0033721 A1 | 2/2006 | Woolley et al. |
| 2006/0038783 A1 | 2/2006 | Shaw et al. |
| 2006/0139323 A1 | 6/2006 | Harley et al. |
| 2006/0161870 A1* | 7/2006 | Hotelling et al. ............ 715/863 |
| 2006/0176270 A1 | 8/2006 | Sachs |
| 2006/0192754 A1 | 8/2006 | Sachs et al. |
| 2006/0202971 A1 | 9/2006 | Kaliher |
| 2006/0267933 A1 | 11/2006 | Tai et al. |
| 2006/0290665 A1 | 12/2006 | Matta et al. |
| 2007/0052691 A1 | 3/2007 | Zadesky et al. |
| 2007/0115263 A1* | 5/2007 | Taylor et al. ............ 345/169 |
| 2007/0247421 A1 | 10/2007 | Orsley |
| 2007/0247446 A1 | 10/2007 | Orsley et al. |
| 2007/0291016 A1 | 12/2007 | Philipp |
| 2008/0088600 A1* | 4/2008 | Prest et al. ............ 345/173 |
| 2008/0164076 A1 | 7/2008 | Orsley |
| 2008/0237766 A1 | 10/2008 | Kim |
| 2008/0283310 A1* | 11/2008 | Moore ............ 178/18.06 |
| 2008/0284742 A1* | 11/2008 | Prest et al. ............ 345/173 |
| 2009/0027333 A1* | 1/2009 | Orsley et al. ............ 345/157 |
| 2009/0057124 A1 | 3/2009 | Orsley et al. |

FOREIGN PATENT DOCUMENTS

| | | |
|---|---|---|
| DE | 10309011 | 9/2004 |
| EP | 1136939 | 9/2001 |
| EP | 1347263 | 9/2003 |
| EP | 1596174 | 11/2005 |
| EP | 1843373 | 10/2007 |
| GB | 2247938 | 3/1992 |
| JP | 2222019 | 9/1990 |
| JP | 7-49325 | 2/1995 |
| JP | 9134248 | 5/1997 |
| JP | 2000/357049 | 12/2000 |
| JP | 2001-255996 | 9/2001 |
| JP | 2001/312363 | 11/2001 |
| JP | 2002181640 | 6/2002 |
| JP | 2002-202852 | 7/2002 |
| JP | 2002-304936 | 10/2002 |
| JP | 2003-50666 | 2/2003 |
| JP | 2003-84881 | 3/2003 |
| JP | 2003/84916 | 3/2003 |
| JP | 2004-335476 | 11/2004 |
| JP | 2005-507112 | 3/2005 |
| JP | 2007-328470 | 12/2007 |
| WO | WO-00/51358 | 8/2000 |
| WO | WO-02/03317 | 1/2002 |
| WO | WO-92-21084 | 3/2003 |
| WO | WO-03/030092 | 4/2003 |
| WO | WO-2006/031332 | 3/2006 |

OTHER PUBLICATIONS

U.S. Appl. No. 60/794,723, filed Apr. 25, 2006, Harley.
U.S. Appl. No. 10/723,957, filed Nov. 24, 2003, Harley.
U.S. Appl. No. 11/407,274, filed Apr. 19, 2006, Orsley.
U.S. Appl. No. 11/923,653, filed Oct. 25, 2007, Orsley.
Avago Technologies, "AMRI-2000-P000 Data Sheet".
"3M Double Coated tapes", *9731 931RW Technical Data*.
"ARS Technica, iPod nano", http://arstechnica.com/reviews/ardware/nano.ars/4,, (1998).
Motoroal SLVR description, unknown author and date: from www.motorola.com/motoinfo/product/details.jsp?globalObjectID=86.
Panasonic Tactile Sheet; Type ESP; unknown author and date.
Avago Technologies AMRI-2000 Data Sheet; unknown author and date.

* cited by examiner

FIG. 3B  ↑↓ = direction of current flow

CONTROL AND DATA ENTRY APPARATUS

RELATED APPLICATIONS

This application claims priority and other benefits from U.S. Provisional patent application Ser. No. 60/966,308 filed Aug. 27, 2007 and entitled "Data Entry Apparatus" to Orsley et al., the entirety of which is hereby incorporated by reference herein.

FIELD OF THE INVENTION

Various embodiments of the invention relate to the field of control and data entry apparatuses generally, and in some preferred embodiments to control and data entry apparatuses for portable or hand-held devices such as cell phones, MP3 players, personal computers, game controllers, laptop computers, PDA's and the like. Embodiments of the invention include those finding application in stationary, portable and hand-held devices, as well as those related to the fields of industrial controls, washing machines, exercise equipment, and other devices. Still further embodiments relate to control and data entry apparatuses where water-, liquid-, gas or vapor-proof or resistant control surfaces and housings are desirable.

BACKGROUND

Portable electronic and digital devices benefit from the inclusion of control and data entry apparatuses that allow for movement of a cursor, actuation of one or more switches, or scrolling of a display. In this context, a mouse or joystick as might be employed in conjunction with desk-top computers is often prohibitively large. A variety of alternative control and data entry apparatuses have therefore been employed.

One approach has been to miniaturize a joystick, as described in U.S. Pat. No. 6,115,030, issued to Berstin et al. (hereafter "the Berstin reference"), hereby incorporated by reference herein in its entirety.

Movable puck or slider based devices are disclosed in U.S. Pat. No. 7,158,115, issued to Harley et al. (hereafter "the first Harley reference") and U.S. patent application Publication No. 2005/0110755 A1 to Harley et al. (hereafter "the second Harley reference"), also hereby incorporated by reference herein in their respective entireties.

One particularly popular control and data entry device takes the form of a circular touch pad that includes switches, and is disclosed in U.S. patent application Publication No. 2007/0052691 to Zadesky et al.; see also U.S. Pat. No. 7,046,230 to Zadesky (hereafter "the Zadesky references"), hereby incorporated by reference herein in their respective entireties. The Zadesky references describes certain aspects of keypads employed with popular iPOD™ devices manufactured by APPLE.™

Among the more ubiquitous control and data entry apparatuses employed in portable electronic devices today are so-called "5-way keypads," which are to be found in many different models and types of mobile telephones, such the MOTOROLA™ SLVR.™ In such 5-way keypad devices, a pad of generally circular shape has a center button and a an outer ring disposed thereabout having arrows corresponding to the four cardinal directions (i.e., N, S, E and W) superimposed thereon. The circular pad is disposed atop a flexible membrane and a series of dome switches disposed beneath the membrane and the pad. Pressing down sufficiently hard upon the circular pad at a location corresponding to an arrow results in the dome switch disposed therebelow being closed or actuated. Similarly, a dome switch is also disposed below the center button. Consequently, the four arrows and center button in a conventional 5-way keypad provide five different switches that can be actuated or closed by a user.

Notably, however, most of the above-described 5-way telephone keypads do not include any scrolling capability, such as that provided by the keypad of an iPOD™ device. The keyboard on an iPOD™ device, however, requires that a user's finger establish skin contact therewith and thereby provide a path to ground before the iPOD™ keypad may be operated. That is, iPOD™ keypads may not be operated by a user wearing gloves, or through the use of a pencil, cursor pen or other such electrically insulated device, mechanism or body part placed or pressed thereon.

In addition to the keypad in an iPOD™ device, the AVAGO AMRX™ keypad provides a 5-way keypad with scrolling functionality provided by way of a combined rotatable wheel and four depressable switches disposed beneath the wheel plus a depressable switch located beneath a central button. Scrolling is effected by physically turning the wheel with a user's finger, and clicking or switch actuation is effected by pressing downwardly upon the wheel or center button. The AMRX keypad is based on reflective optical encoding technology, however, and therefore has a fixed number of counts per revolution of the central wheel. This, in turn, means that the number of counts per revolution of the central wheel cannot be adjusted dynamically to take into account slow or fast movement of the wheel by a user's finger, to thereby adjust the resolution or "fineness" of wheel for different scrolling or selection options. Additionally, it has been discovered that user preferences regarding the stickiness or smoothness of central wheel as a user dials it fore and aft vary considerably, and that it is difficult, if not impossible, to provide a central wheel of a single design and "stickiness" that will meet with the approval of even the majority of users.

Most manufacturers of portable electronic devices such as telephones have different requirements for the physical dimensions of control and data entry apparatuses that are to be incorporated therein, as well as the sizes and positions of components associated therewith, such as membranes, dome switches and sense electrodes. Consequently, adaptation of a control and data entry apparatus of a given design and configuration for use in a commercial product such as a particular mobile telephone model often involves significant tooling costs, especially if, for example, new functionality such as scrolling is to be added to a 5-way keypad otherwise conventional in outward appearance such as with a rotatable wheel.

Finally, many portable and stationary devices have electronic circuitry disposed within the housings thereof that is susceptible to damage or harm owing to the incursion of liquids, gases or vapors inside the housing. This susceptibility is generally heightened in portable devices such as mobile telephones, where users subject such devices to all manner of harsh environmental conditions such as liquids being spilled upon the keypads thereof, salt-laden oceanic air, chemical vapors and so on. Accordingly, it is desirable that such mobile and stationary devices be equipped with control and data entry surfaces or keypads capable of withstanding such environmental rigors.

What is needed is a control and data entry apparatus that: (1) is easily adaptable for use in different portable electronic devices without requiring extensive tooling changes; (2) is resistant to liquids, gases or vapors that might otherwise damage electronic circuitry disposed within the device; (3) provides combined clicking and scrolling functionality in a single keypad without having to provide, for example, a rotatable wheel mechanism; (4) does not require for its operation a path to ground through a user's finger or other body part; and (5) does not require fundamental changes to the outward appearance, functionality, footprint or mechanical structure of a control and data entry apparatus that may therefore be substituted with ease for a conventional key-atop-membrane structure in a portable electronic device.

SUMMARY

Disclosed herein are various embodiments of systems, devices, components and methods associated with control of, and data entry in, hand-held, portable and other devices.

In one embodiment, there is provided a mutual capacitance control and data entry apparatus comprising a tiltable member configured for tilting by a user or a mechanism, an electrically conductive member attached to the tiltable member, a substrate spaced apart from the electrically conductive member by a gap and having a plurality of mutually isolated electrically conductive sense electrodes disposed thereon, a drive signal circuit configured to provide an electrical drive signal to the electrically conductive member and operably connected thereto, a capacitance measurement circuit operably coupled to the electrically conductive member and the sense electrodes, the circuit being configured to detect changes in capacitance occurring between the electrically conductive member and the sense electrodes when the tiltable member is tilted towards the sense electrodes, and a plurality of switches, each such switch being operably connected to a corresponding one of the plurality of sense electrodes and being configured to connect such sense electrode to ground upon being actuated or closed by a user, where tilting of the tiltable member by the user or the mechanism effects a first function in the device, and closing of one of the plurality of switches by the user effects a second function in the device.

In another embodiment, there is provided a mutual capacitance control and data entry apparatus, comprising a rotatable knob mechanism configured for rotation by a user or a mechanism, an electrically conductive member disposed substantially in a second plane and embedded within the rotatable knob mechanism, a substrate disposed substantially in a second plane and spaced apart from the electrically conductive member, the substrate having a plurality of mutually isolated electrically conductive sense electrodes disposed thereon, the second plane being non-parallel and tilted in respect of the first plane, the electrically conductive member being positioned closest to the substrate at a tilted portion thereof, a drive signal circuit configured to provide an electrical drive signal to the electrically conductive member and operably connected thereto, and a capacitance measurement circuit operably coupled to the electrically conductive member and the sense electrodes, where rotation of the rotatable knob mechanism by the user or the mechanism causes the tilted portion sequentially to come into proximity with the sense electrodes as the knob is rotated, the circuit is configured to detect changes in capacitance occurring between the electrically conductive member and the sense electrodes as the tilted portion sweeps across the sense electrodes, and at least a first function is effected by the apparatus in response to the changes in capacitance being sensed by the capacitance measurement circuit.

In a further embodiment, there is provided a mutual capacitance control and data entry apparatus comprising a rotatable knob mechanism configured for rotation by a is user or a mechanism, an electrically conductive member disposed substantially in a second plane and attached to a lower surface of the rotatable knob mechanism, a substrate disposed substantially in a second plane and spaced apart from the electrically conductive member, the substrate having a plurality of mutually isolated electrically conductive sense electrodes disposed thereon, the second plane being non-parallel and tilted in respect of the first plane, the electrically conductive member being positioned closest to the substrate at a tilted portion thereof, a drive signal circuit configured to provide an electrical drive signal to the electrically conductive member and operably connected thereto, and a capacitance measurement circuit operably coupled to the electrically conductive member and the sense electrodes, where rotation of the rotatable knob mechanism by the user or the mechanism causes the tilted portion sequentially to come into proximity with the sense electrodes as the knob is rotated, the circuit is configured to detect changes in capacitance occurring between the electrically conductive member and the sense electrodes as the tilted portion sweeps across the sense electrodes, and at least a first function is effected by the apparatus in response to the changes in capacitance being sensed by the capacitance measurement circuit.

In still another embodiment, there is provided a Hall effect control and data entry apparatus comprising a tiltable member configured for tilting by a user or a mechanism, a plurality of magnets attached to, or disposed within or on, the tiltable member, a substrate spaced apart from the plurality of magnets by a gap and having a plurality of Hall effect sensors disposed thereon, each Hall effect sensor being located beneath a corresponding magnet disposed thereabove, a Hall effect sensing circuit operably coupled to each of the Hall effect sensors, the Hall effect sensors and the circuit being configured to detect changes in magnetism occurring between the Hall effect sensors and the magnets when the tiltable member is tilted towards the Hall effect sensors, a keyboard controller, a plurality of switches disposed beneath the tiltable member and operably connected to the keyboard controller, each such switch being configured for closing by the tiltable member when the tiltable member is pressed downwardly thereupon, wherein tilting of the tiltable member by the user or the mechanism effects a first function in the device, and closing of one of the plurality of switches by the user effects a second function in the device.

Methods of making and using the above embodiments are also contemplated such as a method of making a mutual capacitance control and data entry apparatus comprising providing a tiltable member configured for tilting by a user or a mechanism, providing an electrically conductive member attached to the tiltable member, providing a substrate spaced apart from the electrically conductive member by a gap and having a plurality of mutually isolated electrically conductive sense electrodes disposed thereon, providing a drive signal circuit configured to provide an electrical drive signal to the electrically conductive member and operably connected thereto, providing a capacitance measurement circuit operably coupled to the electrically conductive member and the sense electrodes, the circuit being configured to detect changes in capacitance occurring between the electrically conductive member and the sense electrodes when the tiltable member is tilted towards the sense electrodes, providing a plurality of switches, each such switch being operably connected to a corresponding one of the plurality of sense electrodes and being configured to connect such sense electrode to ground upon being actuated or closed by a user, where the resulting apparatus is configured such that tilting of the tiltable member by the user or the mechanism such effects a first function in the device, and closing of one of the plurality of switches by the user effects a second function in the device.

The above-described embodiments should be considered as examples of the present invention, rather than as limiting the scope of the invention. In addition to the foregoing embodiments of the invention, review of the detailed description and accompanying drawings will show that there are other embodiments of the present invention. Accordingly, many combinations, permutations, variations and modifications of the foregoing embodiments of the present invention not set forth explicitly herein will nevertheless fall within the scope of the present invention.

BRIEF DESCRIPTION OF THE DRAWINGS

Different aspects of the various embodiments of the invention will become apparent from the following specification, drawings and claims in which:

FIG. 3B is a cross-sectional schematic illustration of one embodiment of an electrically conductive member or plate and a corresponding underlying electrode array;

The drawings are not necessarily to scale. Like numbers refer to like parts or steps throughout the drawings.

DETAILED DESCRIPTIONS OF SOME PREFERRED EMBODIMENTS

Some embodiments provide a control and data entry apparatus that operates in accordance with the principles of mutual capacitance, or capacitance occurring between two opposing charge-holding surfaces in which some electrical current passing through one surface passes over into the other surface through a small gap disposed therebetween. Other embodiments provide a control and data entry apparatus that operates in accordance with the principles of self-capacitance, or the capacitance associated with a given electrode in respect of ground. Still other embodiments provide control and data entry apparatuses that operate in accordance with the principles of magnetism and electrical resistivity, more about which is said below. Most of the embodiments described herein, however, employ the principles of mutual capacitance, as those skilled in the art will appreciate readily upon having read the specification and consulted the drawings hereof.

In one embodiment, there is provided a control and data entry apparatus capable of performing multiple functions such as scrolling and clicking by means of single generally ring-shaped control and data entry apparatus typically incorporated into a mobile electronic device such as a laptop computer, a personal data assistant (PDA), a mobile telephone, a cellular telephone, a radio, an MP3 player or a portable music player. A user pushes slightly or deeply upon a tiltable member forming a portion of the control and data entry apparatus to effect scrolling or clicking, as the case may be. In such an embodiment, control and data entry apparatus 19 may assume the form of a ring or disk shaped pad similar in outward appearance and configuration to that disclosed in the Zadesky reference, as illustrated in FIG. 1, where portable device 10 incorporates control and data entry apparatus 19 therein.

Figure 1:
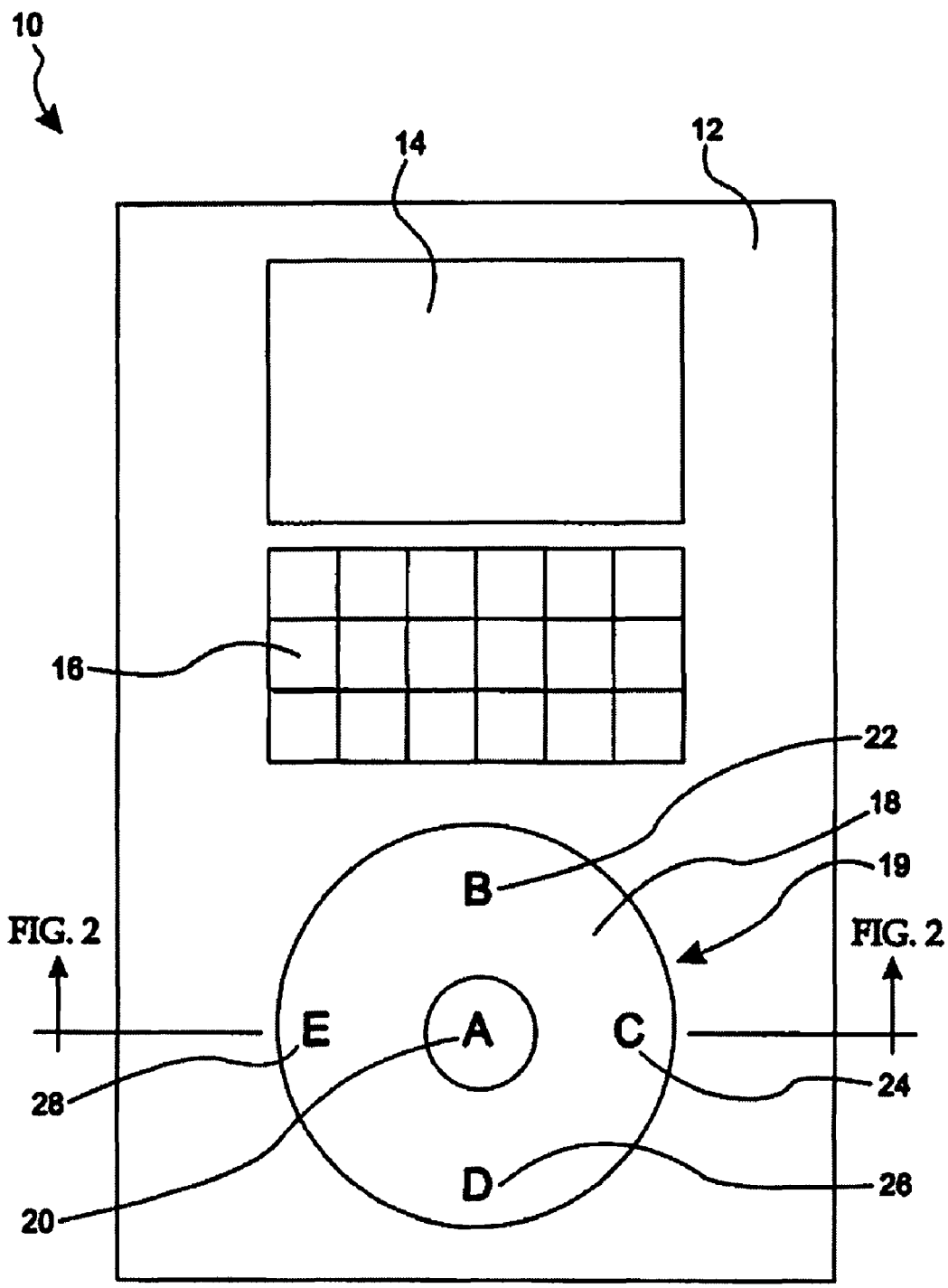
FIG. 1 is a top plan view of the upper surface of a portable device employing a control and data entry apparatus according to one embodiment of the invention.

FIG. 1 is a top plan view of the upper surface of portable device 10 employing control and data entry apparatus 19 according to one embodiment. Device 10 may be a cellular phone, a PDA, an MP3 player, or any other handheld, portable or stationary device employing one or more internal processors. For purposes of illustration, a preferred embodiment is shown in FIG. 1, which is portable. Portable device 10 comprises outer housing 10, which includes display 14, keys 16 and control and data entry apparatus 19. Control and data entry apparatus 19 and keys 16 provide inputs to processor 102 (not shown in FIG. 1), and processor 102 controls display 14. The upper surface of data entry device 19 has buttons labeled A, B, C, D and E in locations overlying switches disposed therebeneath. Central button A 20 is also provided, which may have layer or coating 21 (see FIG. 2) disposed thereon or thereover. In some embodiments, layer or coating 21 may be electrically conductive, and in others electrically insulative, depending on the particular application at hand.

Pressing tiltable member 18 at locations B, C, D or E so as to substantially or deeply deflect tiltable member 18 operates the underlying switches. These switches may be used to control any desired functions, but it is anticipated that in most embodiments such switches will be employed either to control the display or to select items shown by the display. For example, switches underlying buttons B and D might be used to control "page up" or "page down" functions or to move a cursor up or down a displayed list. Buttons E and C might be used to move between lists and/or sub-lists, or between multiple displayed lists. The buttons might also be used for rapid scrolling up, down, or side-to-side of the display. The switch beneath button A, for example, may be used to select a highlighted item on a list or to move between menus. The buttons and corresponding switches disposed therebeneath, however, may also be used to control any function defined by the manufacturer of the portable device.

Tiltable member 18 may be used to control scrolling of the display as a user moves a finger circumferentially around tiltable member 18, where sensed variations of capacitance are employed to control scrolling, analogous to the function provided by the touch pad described in the Zadesky reference. For example, clockwise movement of a users finger atop and along tiltable member 18 may be employed to result in downward scrolling, while counterclockwise movement may be employed to result in upward scrolling. Alternatively, the specific tilt of tiltable member 18 may be configured to control the position of a cursor in a manner analogous to a joystick or to the slidable puck of the Harley references, with the cursor moving in the direction of the tilt, with such movement being proportional to the degree of the tilt. In such embodiments, the switches associated with tiltable member 18 may be omitted or disabled. The degree of tilt required to provide scrolling or cursor control functions may be slight enough that a user does not perceive the tilt, thereby simulating the functionality provided by the touch pad disclosed in the Zadesky reference. In alternative embodiments, variations in capacitances are employed to move a cursor or perform a similar function, in a manner similar to that provided by the movable puck in the Harley references. Significantly, however, and unlike the device described in the Zadesky reference, some embodiments of the invention do not rely on or employ a path to ground through a users finger or other body part, as is required in the touchpads disclosed in the Zadesky references.

In some embodiments, particularly those in which tilt of tiltable member 18 is employed to control scrolling, the control and data entry apparatus may include a plurality of switches arranged around tiltable member 18 as described above in connection with FIG. 1, where the switches are disposed generally adjacent and below the periphery thereof. Such switches are preferably responsive to a greater degree of tilting of tiltable member 18 than that required to perform scrolling. Such switches preferably provide tactile feedback to a user to indicate that switch closure or actuation has occurred. Tactile feedback may be provided by dome-type switches, more about which is said below. Other switch types, however, such as membrane switches or switches disclosed in the Zadesky reference may also be employed.

In some embodiments, control and data entry apparatus 19 includes central switch 36 (not shown in FIG. 1) mounted beneath the center of tiltable member 18 and directly beneath button 20. Switch 36 is preferably configured so that it may be actuated or closed by downward movement of button 20 without activating any other switches that might be disposed beneath the periphery of tiltable member 18. If desired, actuation of central switch 36 may be employed to disable such peripheral switches and/or the capacitive sensing of tilt.

Figure 2:
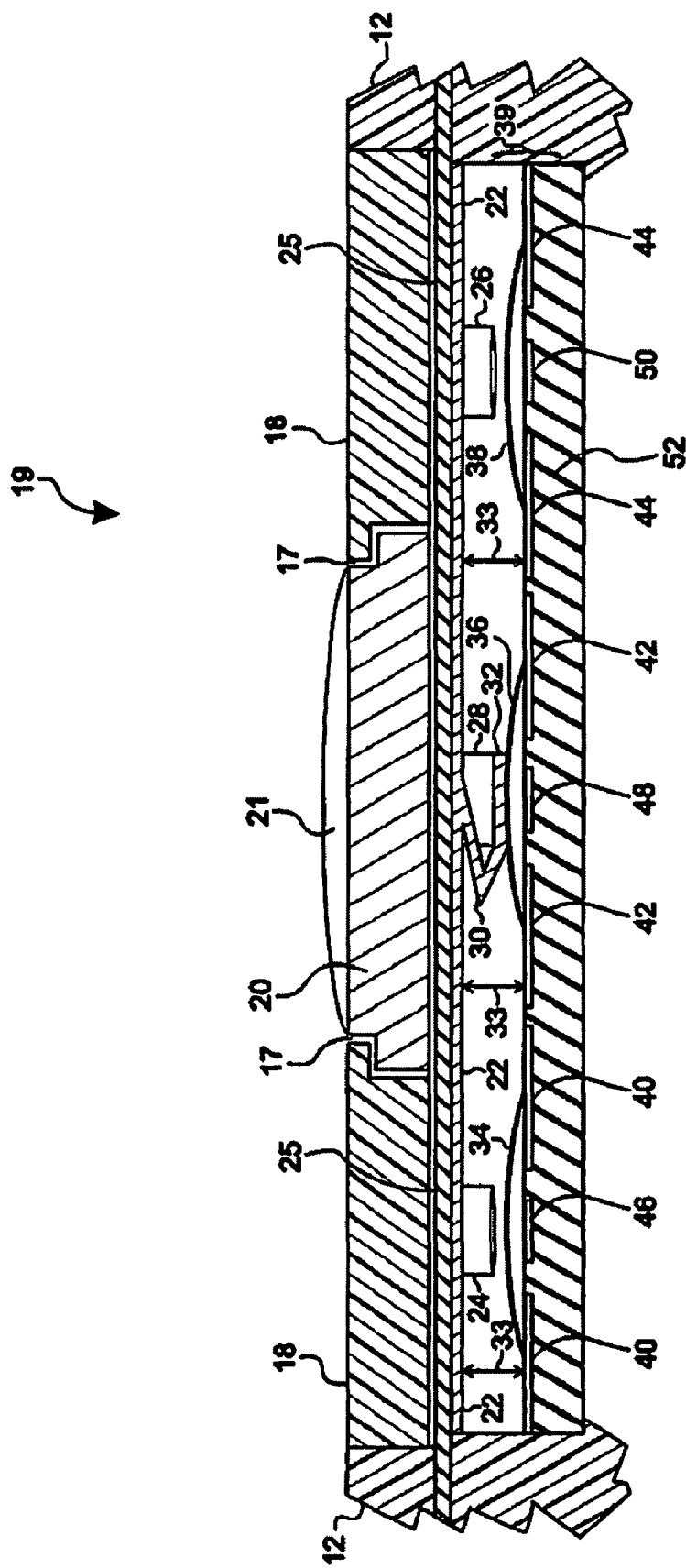
FIG. 2 is a cross-sectional view of one embodiment of a mutual capacitance control and data entry apparatus.

Referring now to FIG. 2, FIGS. 3A-3C, and FIG. 4, device 19 includes tiltable member 18 configured to be tilted through the pressure applied by a user's finger. Tiltable member 18 may assume any of a number of different physical configurations or shapes, such as a disc, a plate, a circle, an ovoid, a square, a rectangle, a cross-shaped member, a star-shaped member, a pentagon, a hexagon, an octagon, and many other suitable shapes and configurations. Tiltable member 18 may be formed substantially within a plane as shown in FIG. 2 (although other non-planar embodiments of tiltable member 18 are contemplated and included within the scope of the invention), and is generally positioned spaced apart from underlying circuit substrate 52. Tiltable member 18 preferably has generally planar electrically conductive member or plate 22 disposed on its underside (i.e., on its inward facing surface). Circuit substrate 52 preferably has a plurality of generally planar electrode surfaces and accompanying switches forming electrode and switch array 39 disposed thereon or therein, which is located below and spaced apart from tiltable member 18. Note that in some embodiments, array 39 may not include one or more of switches 34, 35, 36, 37 or 38.

By slightly tilting and swiping tiltable member 18 (as illustrated schematically in FIG. 4), the respective capacitances between electrically conductive member 22 and sense electrodes 40, 41, 44 and 45 disposed therebelow on substrate 52 are varied, and a first function such as scrolling may be effected. By tilting tiltable member 18 still further and deeper but not swiping (as also illustrated schematically in FIG. 4), a switch located below the portion of tiltable member 18 which is pressed may be closed or actuated, thereby effecting a second function, such as a click.

In a preferred embodiment of device 19, tiltable member 18 is constrained by flexible membrane 25 or other portions of device 10 to tilt through a maximum vertical distance of about 0.10 mm, about 0.20 mm, about 0.30 mm, about 0.40 mm, about 0.50 mm, about 0.60 mm and about 0.70 mm, or to tilt through a vertical distance ranging between about between about 0.20 mm and about 0.40 mm, between about 0.10 mm and about 0.60 mm, and about 0.05 mm and about 0.80 mm. Other ranges of tilt or deflection for tiltable member 18 are of course also contemplated.

The values of the individual capacitances between electrically conductive member 22 and sense electrodes 40, 41, 44 and 45 mounted on substrate 52 are monitored or measured by capacitance sensing circuitry 104 (see FIG. 5) located within portable device 10, as are the operating states of switches 34, 35 (not shown in FIG. 2), 36, 37 (not shown in FIG. 2) and 38. In a preferred embodiment, a 125 kHz square wave drive signal is applied to electrically conductive member 22 by sensing circuitry 104 through electrically conductive drive electrode 42 and center dome switch 36 so that the drive signal is applied continuously to electrically conductive member 22, although those skilled in the art will understand that other types of AC and DC drive signals may be successfully employed. Indeed, the drive signal need not be supplied by capacitance sensing circuitry 104, and in some embodiments is provided by a separate drive signal circuit. In a preferred embodiment, however, the drive signal circuit and the capacitance sensing circuit are incorporated into a single circuit or integrated circuit.

In a mutual capacitance embodiment of control and data entry apparatus 19, during operation thereof some portion of the charge corresponding to the drive signal is transferred across the gap between member 22 and sense electrodes 40, 41, 44 and 45, thereby effecting capacitance 51 therebetween (see, for example, FIG. 3B).

Referring to FIG. 2, there is shown a cross-sectional view of one embodiment of control and data entry apparatus 19 corresponding to that illustrated in FIG. 1. In FIG. 2, the relationship between tiltable member 18 and drive electrode 42, sense electrodes 40 and 44 and switches 34, 36 and 38 disposed therebeneath, is illustrated. Tiltable member 18 may be formed of an electrically insulative, relatively rigid material, such as a suitable plastic, and located within an opening disposed in housing 12 of the device. Electrically conductive materials may also be used to form, or be disposed upon, tiltable member 18, however.

Tiltable member 18 is coupled to housing 12 by means of flexible membrane 25, formed, for example, of silicone, silicone rubber, an elastomeric material, or any other suitable flexible, resilient or deformable material. Flexible membrane 25 is most preferably formed of a material and has dimensions and a physical configuration and shape such that tiltable member 18 is restored to its resting or non-deformed position once a user's finger stops applying pressure or force thereto. Other means of returning tiltable member 18 to its resting or non-deformed position may also be employed, in addition to or as a substitute for the mechanical biasing functionality of membrane 25 described hereinabove, such an elastic or elastomeric member or glue disposed beneath the center of tiltable member 18 similar to glue 332 disclosed in the Berstin reference.

In a preferred embodiment, flexible membrane 25 is configured to impart leak-tightness, leak resistance, gas-tightness, gas resistance, or vapor-tightness or vapor resistance to device 10 such that liquid or gas spilled or otherwise coming into contact with tiltable member 18, or with seam 17 disposed between housing 12 and tiltable member 18, cannot enter, or is inhibited from entering, the interior of device 10 to damage, hinder or render inoperable the electrical and electronic circuitry disposed therewithin. Flexible membrane 25, housing 12 and tiltable member 18 may also be configured to permit underwater operation of device 10. Similarly, flexible membrane may be configured to protect the electrical and electronic components disposed within housing 12 from the deleterious effects of salt-laden air or other harmful gases or vapors, such as is commonly found in ocean or sea environments, or from mud, dirt or other particulate matter such as dust or air-borne contaminants or particles.

Electrically conductive plate or member 22 is disposed beneath the lower surface of tiltable member 18 and separated therefrom by flexible membrane 25. Electrically conductive member 22 is preferably thin (e.g., about 0.1 mm in thickness) and formed of a strong, flexible, light material such as stainless steel or any other suitable metal or material, as illustrated in further detail in FIG. 3A. Electrically conductive member 22 may assume any of a number of different physical configurations or shapes, such as a series of discrete strips or members electrically connected to one another, a disc, a plate, a circle, an ovoid, a square, a rectangle, a cross-shaped member, a star-shaped member, a pentagon, a hexagon, an octagon, or any other suitable shape or configuration. Electrically conductive member 22 may also be an electrically conductive coating (such as a clear conductor like indium tin oxide or ITO for better illumination from a light guide disposed beneath membrane 25), paint, polymer, adhesive, epoxy or other material disposed on the underside, formed integral to, or disposed within flexible membrane 25.

Figure 3A:
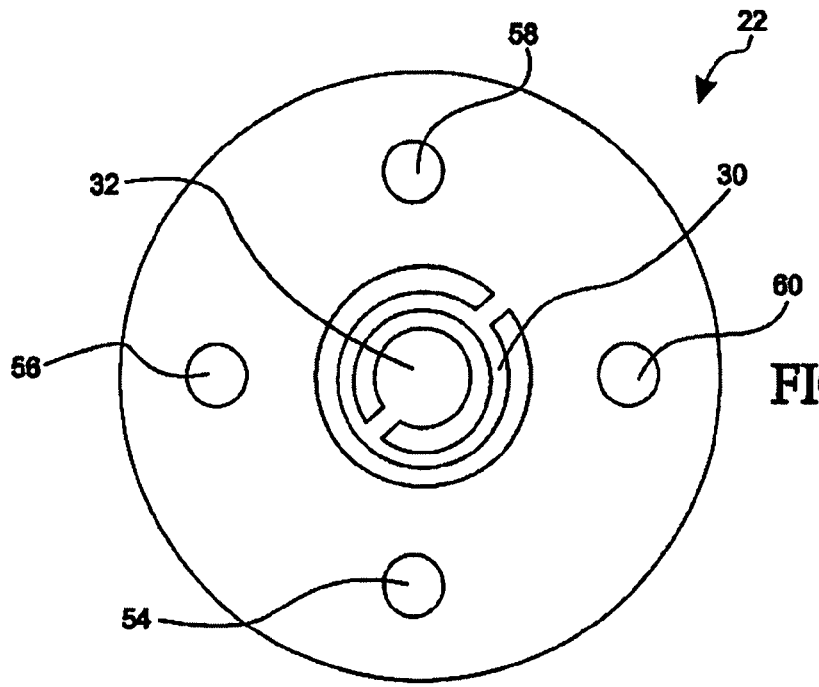
FIG. 3A is a top plan view of one embodiment of an electrically conductive member or plate.

As illustrated in FIG. 3A, in one embodiment electrically conductive member 22 has a series of holes 54, 56, 58, 60 disposed therethrough configured to accept therein membrane plungers for actuating dome switches 34, 35, 37 and 38 such that tiltable member 18 may actuate or close such switches upon being deeply tilted or pressed by a user's finger.

In an embodiment particularly well suited for use in a portable electronic device such as a mobile telephone, electrically conductive member 22 is substantially planar in shape and has a diameter approximating between about 10 mm and about 50 mm or at least one of about 12 mm, about 14 mm, about 16 mm, about 18 mm, about 20 mm, about 30 mm and about 40 mm. Other diameters and shapes of member 22 are of course contemplated. Note that gap 33 becomes smallest at the outermost edges or periphery of electrically conductive member, and thus electrical coupling between member 22 and peripheral electrode 40, 41, 44 and 45 is enhanced at the outer edges of member 22. In most embodiments, the diameter of member 22 is matched or close to that of electrode and switch array 39.

In some embodiments not illustrated in the Figures hereof, an optional light guide layer of conventional construction may be disposed between flexible membrane 25 and electrically conductive member 22, and is configured to allow light to shine through any translucent or transparent areas that might be disposed in and/or around tiltable member 18. Alternatively, the light guide may be disposed atop domes 34-38 and thus beneath electrically conductive member 22.

Substrate 52 is a printed circuit board and in one embodiment comprises FR-4 fiberglass, although many other materials and compositions suitable for use in printed circuit boards may also be used, such as FR-2 fiberglass, polyimide, GETEK™, BT-epoxy, cyanate ester, PYRALUX™, polytetrafluoroethylene (PTFE) or ROGERS BENDFLEX™. In a preferred embodiment, substrate 52 has electrically conductive traces formed of copper disposed thereon or therein, which may be formed by any of a number of methods known to those skilled in the art, such as silk screen printing, photo-engraving with a photomask and chemical etching, PCB milling and other suitable techniques.

In one embodiment, tiltable member 18 is provided with four downwardly extending protrusions located beneath cardinal points B, C, D and E and generally adjacent the periphery of tiltable member 18, of which two such protrusions, 24 and 26, are shown in FIG. 2. As illustrated, such protrusions may form a portion of flexible membrane 25, but may also be formed as a portion of tiltable member 18 and extend through openings disposed in flexible membrane 25. These protrusions are employed to engage the corresponding respective tops of dome switches 34, 35, 37 and 38 disposed therebelow (see, for example, FIG. 3C, where dotted lines 34, 35, 37 and 38 represent the bottom surfaces of dome switches 34, 35, 37 and 38 mounted adjacent sense electrodes 40, 41, 45 and 44, respectively). Two such peripheral dome switches are illustrated in FIG. 2 (i.e., dome switches 34 and 38). As illustrated, protrusions 24 and 26 are spaced from dome switches 34 and 38 when tiltable member 18 is in a first un-tilted, resting or non-deformed configuration. Such spacing permits limited tilting of tiltable member 18 and associated electrically conductive member 22 into a second slightly or shallowly tilted position without engaging, actuating or closing switches 34 and 36. As discussed above, such shallow or limited tilting of tiltable member 18 is sufficient to alter the spacing between electrically conductive member 22 and electrodes 40, 41, 44 and 45 disposed on substrate 52, and are configured to permit capacitance sensing circuitry 104 in device 12 to detect a slight deflection of tilting member 18. In some alternative embodiments, protrusions extend upwardly from the tops of dome switches 34, 35, 37 and/or 38, and allow such switches to function in essentially the same manner.

Figure 3C:
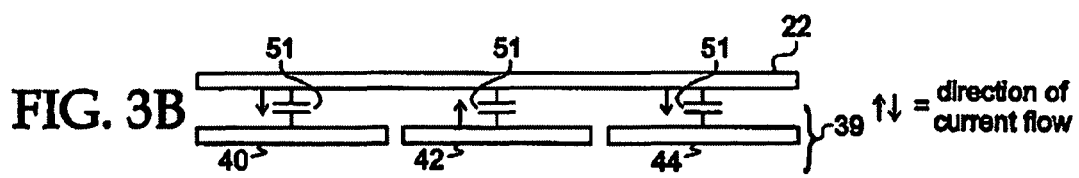
FIG. 3C is a top plan view of the electrode and switch array of FIG. 3B.
Figure 3C:
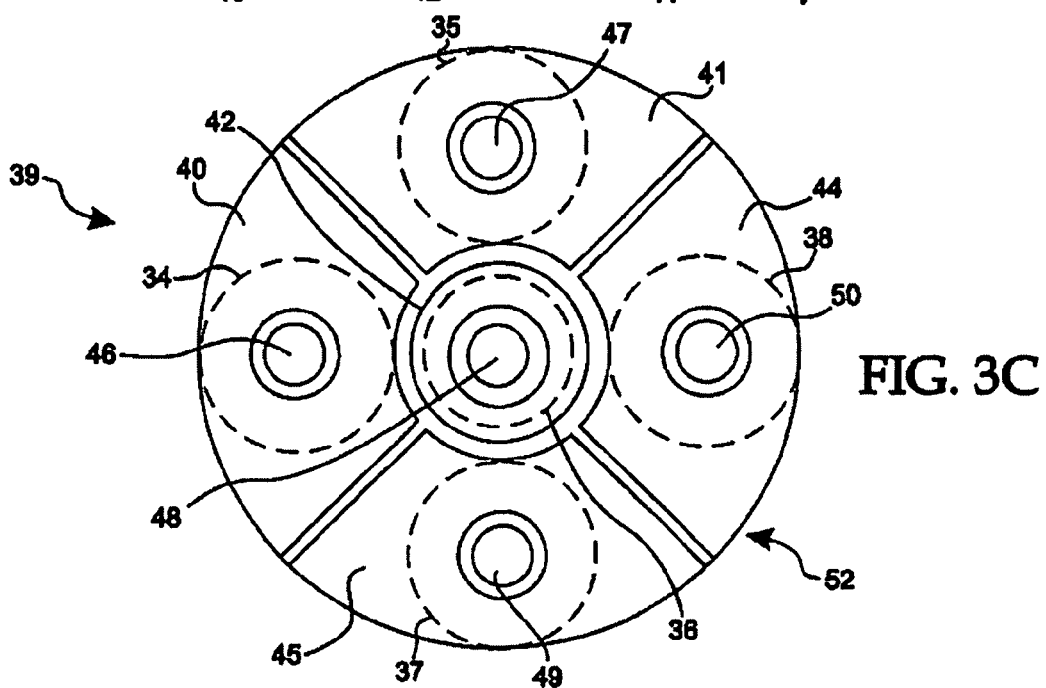

Dome switches 34, 35, 37 and 38 are mounted on and electrically coupled to electrodes 40, 41, 44 and 45 mounted on substrate 52. When pressed downwardly, domes 34, 35, 37 and 38 couple electrodes 40, 41, 44 or 45 to ground through ground electrical contacts 46, 47 (not shown in FIG. 2), 49 (not shown in FIG. 2) and 50, respectively, positioned within openings in ring-shaped electrodes 40, 41, 44 and 45 (as illustrated in FIG. 3C). Coupling of electrodes 40, 41, 44 and 45 to ground is detected by capacitance sensing circuitry 104 as the capacitive signal from the respective sense electrode falls to zero due to the drive signal being taken to ground, and as discussed above may be employed to trigger or disable any desired function. The arrangement of electrically conductive surfaces or traces on substrate 52 is illustrated in more detail in connection with FIG. 5 hereinbelow. In one embodiment, dome switches 34, 35, 36, 37 and 38 are provided as a pre-manufactured sheet attached to substrate 52 by means of adhesive disposed on the underside of the sheet. One such suitable sheet that may be adapted for use in such an embodiment is manufactured by PANASONIC™ under the mark ESP.™

Figure 5:
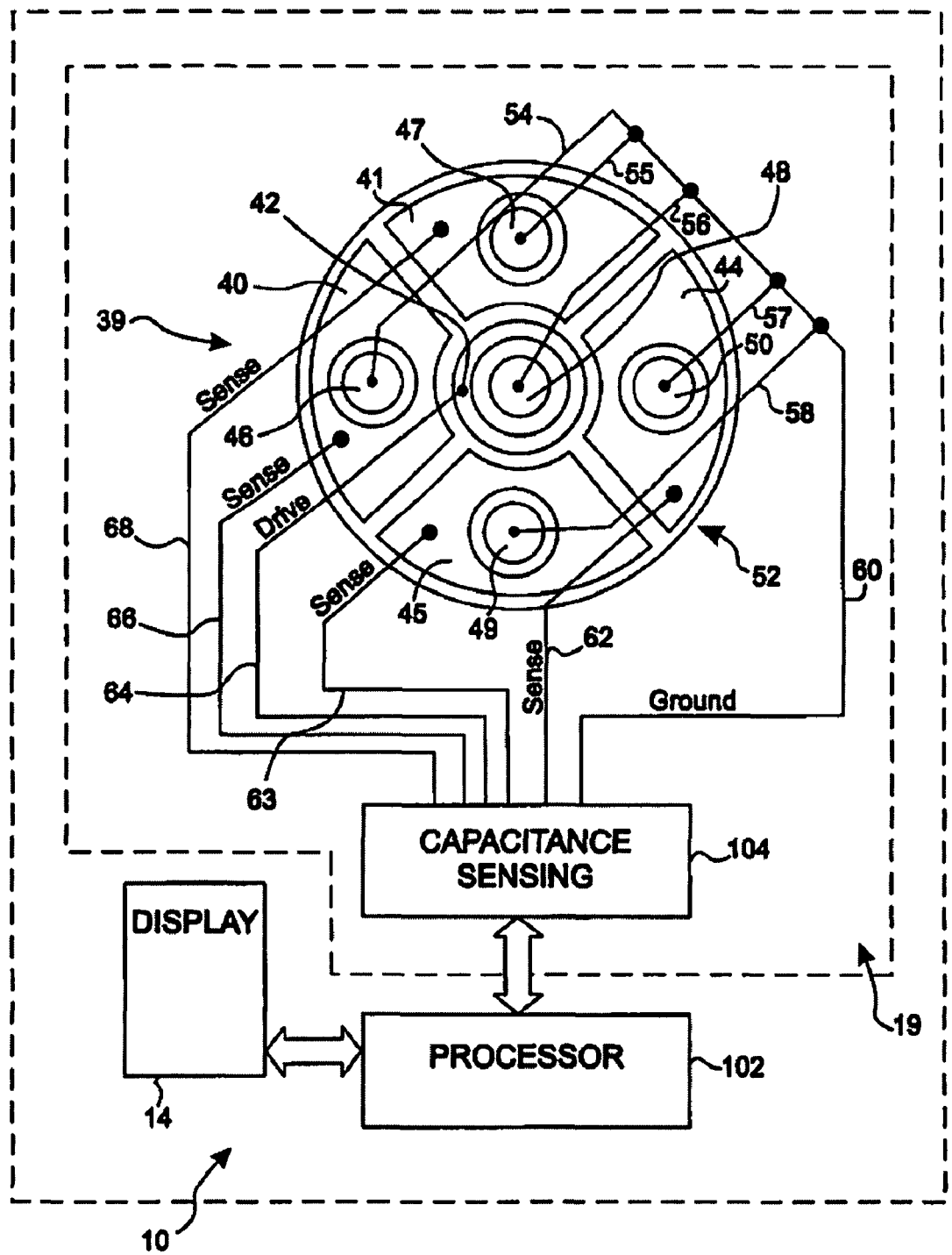
FIG. 5 illustrates one embodiment of an electrode and switch array and its connection to capacitance sensing circuitry, a host processor and a display.

Note that dome switches 34, 35, 36, 37 and 38 illustrated in FIGS. 2, 3C and 5 provide capacitive sensing of switch actuation by coupling a sense or drive electrode to ground. This arrangement and configuration is quite different from that disclosed in the prior art as in, for example, U.S. Pat. No. 7,123,028 to Okana (hereafter "the Okana reference"), where dome switches are not connected electrically to sense or drive electrodes, and instead are connected to circuits separate and apart from such sense or drive electrodes. See, for example, switches 30-0 through 30-4 illustrated in FIG. 29 of the Okana reference. It will be seen that a dome switch arrangement of the type disclosed in the Okana reference requires a large amount of valuable surface area on a substrate having an electrode and switch array disposed thereon, and that such surface area is consumed at the expense of sense electrode surface area because both poles of the switches are electrically separate and apart from those associated with the sense electrodes. As sense electrode surface area is diminished, the sensitivity of sense electrodes diminishes accordingly. Consequently, switch arrangements of the type disclosed in the Okada reference are difficult to make both small and sensitive. Contrariwise, in the embodiments illustrated in FIGS. 2, 3C, and 5 hereof, only central contact disks 46, 47, 48, 49 and 50 need occupy valuable surface area on substrate 52, as dome switches 34-38 need only provide electrical connections between drive electrode 42 and ground contact 48, or between sense electrodes 40, 41, 44 and 45 and corresponding ground contacts 46, 47, 49 and 50. As a result much less surface area is occupied by switch contacts on substrate 52 than in, for example, the Okada reference, thereby permitting device 19 to be made smaller, or with increased sensitivity due to enlarged sensing electrodes, or both, in respect of prior art switch and electrode array configurations. Indeed, as the dome switches are electrically conductive and cover their corresponding underlying ground contacts, essentially no surface area is sacrificed from any of the sense electrodes or sense electrode wedges 40, 41, 44 and 45.

Capacitive sensing circuitry 104 may be configured to require a series of capacitance changes indicative of movement of a user's finger circumferentially around tiltable member 18 over a minimum arc, such as 45, 90 or 180 degrees, or indeed any other predetermined suitable range of degrees that may be programmed by a user in capacitive sensing circuitry 104, before a scrolling function is activated or enabled. In the absence of a detected switch closure, successive capacitance minima or maxima may be measured sequentially through two or more peripheral electrodes. Such a scheme avoids accidental scrolling during a deep tilt to actuate a peripheral dome.

Located in the center of tiltable member 18 is central button 20, which is provided with downward protrusion 28 configured to engage the top of dome switch 36. Electrically conductive member 22 is provided with a downwardly extending member 30, which in turn carries coupling electrode 32 that is electrically coupled to dome 36 of the central switch through capacitive or physical contact therewith. One embodiment of electrically conductive member 22 is illustrated in detail in FIG. 3B hereof (note that for purposes of clarity FIG. 3B does not show dome switches 34, 36 and 38 disposed between electrodes 40, 42 and 44 and electrically conductive member 22). In one embodiment, dome switch 36 is operably and electrically coupled to drive electrode 42, mounted to substrate 52 and provided with a 125 kHz square wave drive signal by the associated capacitance sensing circuitry 104 within device 19. In a preferred embodiment, capacitance sensing circuitry 104 is an Avago AMRI-2000 integrated circuit especially configured for this purpose. Electrically conductive member 22 is electrically coupled to drive electrode 42 such that variations in capacitance between surface 22 and electrodes 40, 41, 44 and 45 may be detected. Ohmic coupling of electrically conductive member 22 to drive electrode 42 has the additional substantial benefit of shielding control and data entry apparatus 19 from any variations in capacitance that might be associated with a path to ground through a user's finger.

As illustrated in FIG. 2, center button 20 is provided with downward protrusion 28 that is longer than protrusions 24 and 26 associated with the peripheral dome switches 34 and 38. In the embodiment illustrated in FIG. 2, protrusion 28 is in constant physical contact with the top surface of dome switch 36 via central disc portion 32. Such a configuration permits dome switch 36 to be deflected downwardly by a user's finger and into contact with ground contact 48 without activating any of peripheral dome switches 34, 35, 37 or 38. When dome switch 36 contacts ground contact 48, the drive signal applied to electrode 42 is shorted to ground, thereby causing all sense signals to fall to zero, and may be used to trigger any desired function such as disabling switches 34, 35, 37 and 38 or, for example, selecting an item on a menu.

FIG. 3A is a top plan view of one embodiment of an electrically conductive member or plate 22, which underlies tiltable member 18 and in one embodiment is generally coextensive therewith. Member 22 in this embodiment is a perforated metal disc fabricated, for example, of stainless steel, aluminum, or indeed of any other suitable electrically conductive material, as discussed above. Four apertures 54, 56, 58 and 60 are formed in member 22 through which corresponding downward protrusions disposed on the underside of flexible membrane 25 project. As illustrated in FIG. 2, downwardly extending member 30 is tilted downwardly from the major portion of member 22 so that coupling electrode 32 may establish electrical contact with the top portion of dome switch 36 and thereby couple electrically conductive member 22 to the drive signal provided by capacitive sensing circuitry 104. When electrically conductive member 22 is in ohmic contact with dome 36, capacitance variations associated with paths to ground arising through a users finger are prevented from interfering with the operation of control and data entry apparatus 19, although in some cases capacitive coupling between coupling electrode 32 and dome 36 may be sufficient to provide adequate coupling to control navigation.

FIG. 3B is a cross-sectional schematic illustration of one embodiment of electrically conductive member 22 and corresponding underlying electrode and switch array 39; for the sale of clarity, no switches are shown in FIG. 3B. As illustrated in FIG. 3C, pie-shaped sense electrodes 40, 41, 44 and 45 are disposed radially about central drive electrode 42. Each of sense electrodes 40, 41, 44 and 45 has a corresponding central ground contact 46, 47, 49 or 50 disposed therewithin. As shown schematically in FIG. 3B, the drive signal from drive electrode 42 flows capacitively to electrically conductive member or plate 22 and then on to surrounding sense electrodes 40, 41, 44 and 45 for sensing by capacitance sensing circuitry 104.

Figure 4:
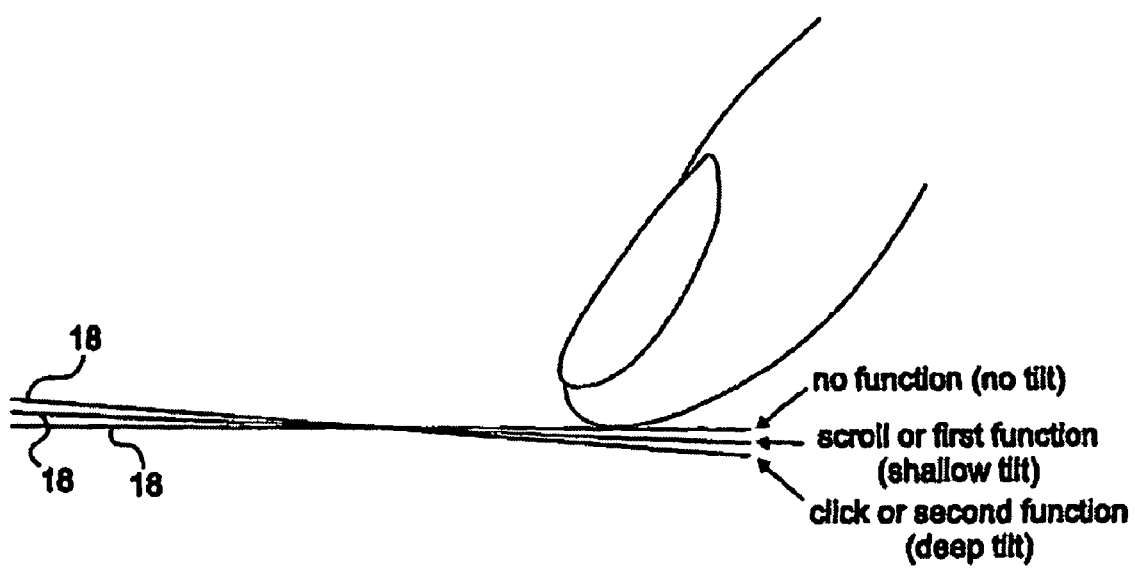
FIG. 4 illustrates no tilting, shallow tilting and deep tilting by a user's finger of one embodiment of a tiltable member.

FIG. 4 illustrates no tilting, shallow tilting and deep tilting of one embodiment of tiltable member 18 by a user's finger, as discussed further hereinabove. In one embodiment, when tiltable member 18 is not tilted, no scroll or click operations may occur. When tiltable member 18 tilted slightly (i.e., "shallow tilt" position), a first function may be effected through the movement of a user's finger sweeping around tiltable member 18 (e.g., scrolling of selected functions). When tiltable member 18 tilted further (i.e., "deep tilt" position), a second function may be effected through the movement of a users finger (e.g., clicking to choose selected functions). Thus, in a preferred embodiment, no functionality is effected in the "no tilt" mode, scrolling is effected by a "shallow tilt" mode plus a sweeping motion and clicking is effected by a "deep tilt" mode. Button 20 is used independently of the tilting of tiltable member 18 to effect clicking or actuation of center dome switch 36.

In one embodiment, slight tilting of tiltable member 18 corresponds to a first vertical displacement of the tiltable member ranging between about 0.25 mm and about 0.40 mm, between about 0.20 mm and about 0.45 mm and between about 0.15 mm and about 0.50 mm, and deep tilting of tiltable member 18 corresponds to a second vertical displacement of the tiltable member ranging between about 0.45 mm and about 0.65 mm, between about 0.40 mm and about 0.70 mm and between about 0.30 mm and about 0.80 mm.

FIG. 5 illustrates one embodiment of electrode and switch array 39 and its connection to capacitance sensing circuitry 104, host processor 102 and display 14. FIG. 5 illustrates the schematic arrangement of electrically conductive drive electrode trace or conductor 64, electrically conductive sense electrode traces or conductors 62, 63, 66, 68, and ground traces or conductors 54, 55, 56, 57, 58 and 60 on substrate 52, and the electrical connections of such traces and electrodes to capacitance sensing circuitry 104, which as described above in a preferred embodiment is an integrated circuit especially designed for the purpose of sensing changes in capacitance and reporting same to host processor 102. FIG. 5 also illustrates schematically the connections between capacitance sensing circuitry 104 and host processor 102, and between host processor 102 and display 14. As illustrated, electrical conductors 54, 55, 56, 57, 58, 60, 62, 63, 64, 66 and 68 couple sense and drive electrodes 40, 41, 42, 44 and 45, and ground contacts 46, 47, 48, 49 and 50, to capacitance sensing circuitry 104, which in turn is operably coupled to other circuitry disposed in device 10.

In the embodiment illustrated, substrate 52 is provided with four peripheral pie-shaped electrodes 40, 41, 44 and 45 and drive electrode 42, all of which are fabricated from a layer of conductive metal (preferably copper) disposed on or in substrate 52 according to any of the various techniques described above, or using other suitable techniques known to those skilled in the art. Electrically conductive member 22 overlies, and in a resting non-actuated position is spaced apart from, electrodes 40, 41, 44 and 45. Tilting of electrically conductive member 22, as discussed above, changes the relative respective capacitances between peripheral electrodes 40, 41, 44 and 45 and member 22, which in a preferred embodiment is continuously electrically coupled to central drive electrode 42. Electrically conductive member 22 is coupled to drive electrode 42 such that capacitance changes may be measured by capacitance sensing circuitry or integrated circuit 104 via conductors 62, 63, 66 and 68.

Ground contacts 46, 47, 49 and 50 are located within openings disposed in peripheral electrodes 40, 41, 44 and 45, and in a preferred embodiment are electrically coupled to peripheral electrodes 40, 41, 44 and 45 when dome switches 34, 35, 37 and 38 corresponding respectively thereto are actuated or closed, thereby allowing capacitance sensing circuitry 104 to detect switch activation via conductors 62, 63, 66 and 68. Drive electrode 42 is also coupled to ground via contact 48 when central dome switch 36 corresponding thereto is actuated or closed, allowing capacitance sensing circuitry 104 to detect switch closure via conductors. 62, 63, 66 and 68. (Note that in the embodiment illustrated in FIG. 5, the detection of capacitance changes requires monitoring sense conductors 62, 63, 66 and 68. Shorting the drive signal to ground causes signals on those lines to fall to zero.)

When any of peripheral dome switches 34, 35, 37 and 38 is actuated or closed, the sense electrode corresponding thereto is tied to ground, thereby causing the capacitive signal to fall to zero. In a preferred embodiment, when center dome switch 36 is actuated or closed, drive electrode 42 is tied to ground and all capacitive signals associated with all of sense electrodes 40, 41, 44 and 45 fall to zero. In such a manner the five different clicks and respective output signals associated therewith are generated by buttons A, B, C, D and E, corresponding sense electrodes 40, 41, 44, 45 and drive electrode 42, and dome switches 34, 35, 36, 37 and 38.

It should be noted that while the embodiments disclosed in Figures employ four peripheral switches, four peripheral electrodes and one central or drive electrode, two, three, five or other numbers of such structures or elements may instead be employed.

As illustrated, peripheral electrodes 40, 41, 44 and 45 and drive electrode 42 disposed on or in substrate 52 are electrically coupled to capacitance measurement circuitry 104, which in turn produces output signals routed to host processor 102 via, for example, a serial I$^2$C-compatible or Serial Peripheral Interface (SPI) bus, where such signals are indicative of the respective capacitances measured between the electrically conductive member 22 and peripheral electrodes 40, 41, 44 and 45. In the case where capacitance measurement circuitry 104 is an Avago AMRI-2000 integrated circuit, the AMRI-2000 may be programmed to provide output signals to host processor 102 that, among other possibilities, are indicative of the amount of, or change in the amount of, spatial deflection of tiltable member 18 (e.g., dX and/or dY) or the number and/or type of clicks or scrolling sensed with this number potentially dynamically variable based upon the speed of the sweep of the finger. Host processor 102 may use this information to control display 14 as discussed above. Circuitry 104 may be any appropriate capacitance measurement circuit or integrated circuit and may, for example, correspond to those employed in the above-cited Harley references. Capacitance sensing circuitry 104 also detects the grounding of any of electrodes 40, 42, 41, 44 and 45 on substrate 52.

Figure 6:
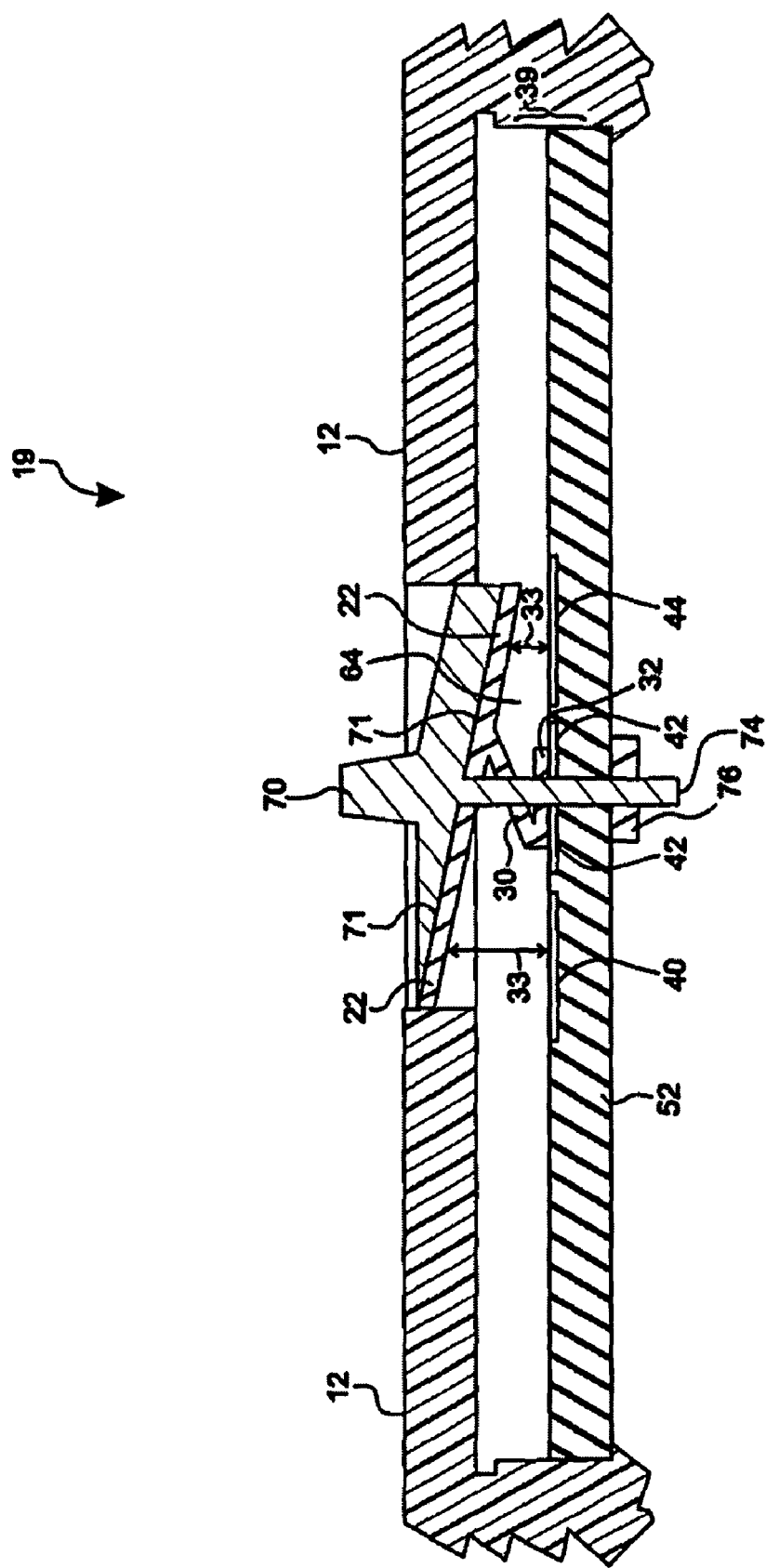
FIG. 6 is a cross-sectional view of another embodiment employing a rotatable knob having a tilted lower surface, where rotation of the knob varies the tilt of the tiltable member in respect of the underlying electrode array.
Figure 7:
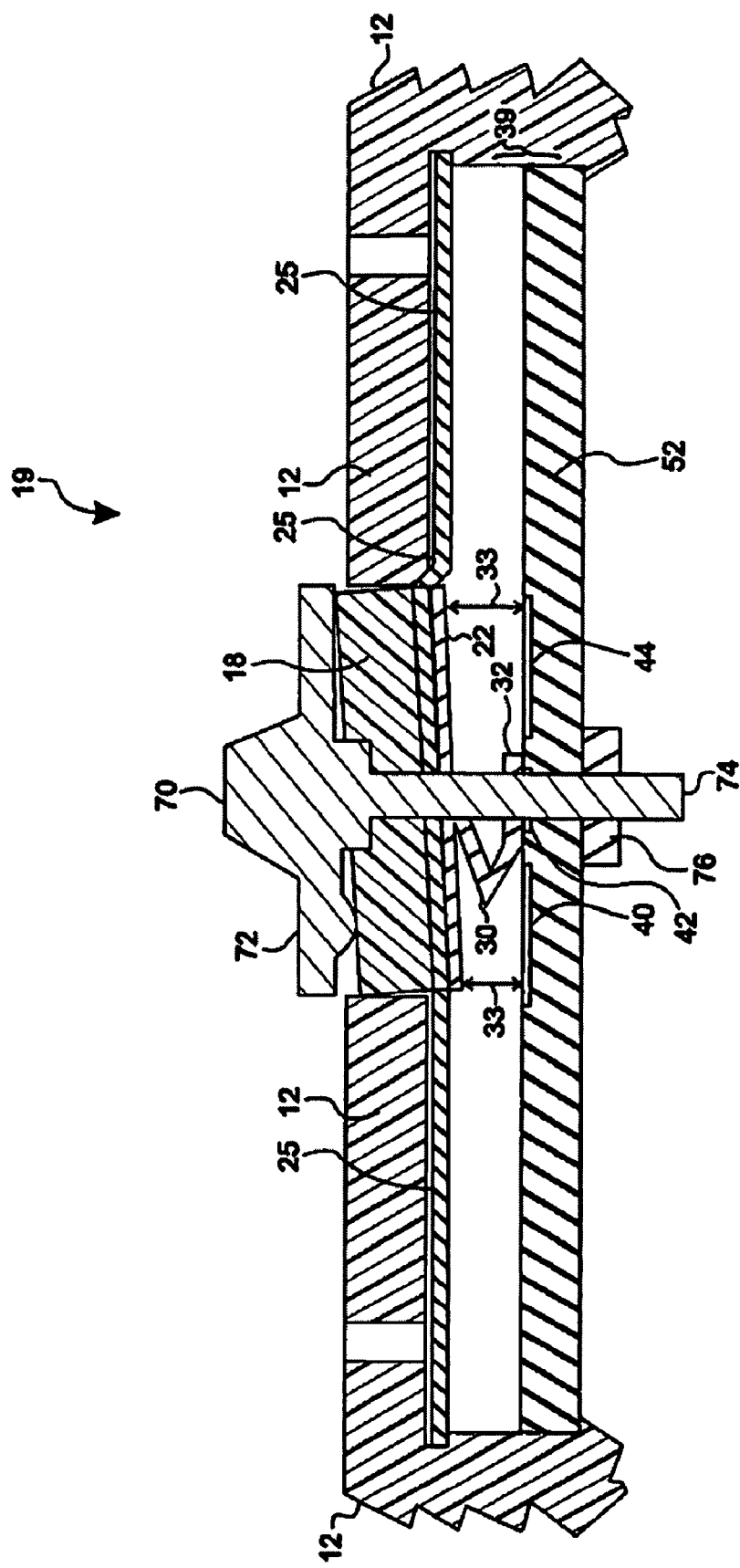
FIG. 7 is a cross-sectional view of yet another embodiment employing a rotatable knob with a protrusion extending downwardly therefrom, where rotation of the knob varies the tilt of an underlying electrically conductive member or plate sensing plate in respect of the electrode array.

In some alternative embodiments of the invention illustrated in FIGS. 6 and 7, rather than tilting tiltable member 18 by means of a user's finger, rotary knob 70 is employed to effect tilting. In some of these embodiments, rotatable knob 70 is provided with tilted lower or inward surface 71 carrying electrically conductive member 22. In such embodiments, rotation of knob 70 varies the tilt of electrically conductive member 22 relative to electrodes 40, 41, 44 and 45 disposed therebeneath. In other embodiments, knob 70 is provided with downward protrusion 72 that slightly tilts tiltable member 18 downward or inward in the region beneath protrusion 72. Rotation of knob 70 results in functionality manner similar to that provided by a user moving a finger circumferentially around the disc in other embodiments described and shown herein, and likewise may be employed to control scrolling.

FIG. 6 is a cross-sectional view of an embodiment employing rotatable knob 70 having a tilted lower surface 71 with electrically conductive member 22 disposed thereon or therein. Knob 70 is preferably formed of an electrically insulative material such as plastic and is provided with downwardly extending central post 74, which near the bottom end thereof is supported by bearing 76. Rotation of knob 70 causes tilted lower surface 71 with electrically conductive member 22 to sweep across and into proximity with at least one of peripheral electrodes 40, 41, 44 or 45 disposed therebeneath. As shown in FIG. 6, gap 33 between electrically conductive member 22 varies according to which portion of electrically conductive member 22 is in proximity to which peripheral electrode 40, 41, 44 or 45 disposed thereunder. In the case where the lowest portion of tilted lower surface 71 is in proximity to any one of sense electrodes 40, 41, 44 or 45, gap 33 is relatively small. In the case where the highest portion of tilted lower surface 71 is not in proximity to any one of sense electrodes 40, 41, 44 or 45, gap 33 is relatively large. In a preferred embodiment, the tilting and capacitance sensing mechanism illustrated in FIG. 6 contains no tiltable member 18, and peripheral dome switches 34, 35, 37 and 38 are omitted. Contact electrode 32 is electrically coupled to electrically conductive member 22 by downwardly extending member 30 and rotates against the upper surface of drive electrode 42. Embodiments incorporating both knob 70 and switches 34, 35, 37 and 38 are also contemplated, however.

Note that in the embodiment illustrated in FIG. 6, as well as in the embodiments illustrated in the other Figures, physical contact between contact electrode 32 and drive electrode 42 may not be required to effect sufficient transfer or coupling of a square wave or other suitable drive signal between contact electrode 32 and drive electrodes 42, as under some circumstances such a signal may be transferred effectively through capacitive means across a small gap disposed therebetween. Physical contact between such contact electrodes and drive electrodes does help provide optimum signal coupling, however, and thereby reduces the effects of interfering, unwanted or outside signals. Measurements of relative capacitance changes between electrically conductive member 22 and peripheral electrodes 40, 41, 44 and 45 on substrate 52 operate as in the embodiments discussed above.

In alternative embodiments, knob 70 may be fabricated of an electrically conductive material and its lower surface may provide essentially the same function as electrically conductive member 22 discussed above in connection with FIG. 6. In another embodiment, at least the upper portions or exposed surfaces of conductive knob 70 are electrically non-conductive to prevent or inhibit signal drain caused by ground paths established through a user's finger. The lower portion of rotatable knob 70 in proximity to lower surface 71 may be plated or coated with an electrically conductive material or metal to provide the functionality associated with electrically conductive member 22 described above in connection with other embodiments.

FIG. 7 is a cross-sectional view of yet another embodiment employing rotatable knob 70 with protrusion 72 extending downwardly therefrom, where rotation of knob 70 varies the tilt of underlying electrically conductive member 22 in respect of electrode array 39. In this embodiment, rotatable knob 70 provides a tilting function respecting tiltable member 18 via protrusion 72 disposed on the underside of knob 70 as a substitute for tilting induced by a user's finger. This embodiment corresponds generally to that illustrated in FIGS. 1 through 5 hereof, with differences described below. As in the above-described embodiments, tiltable member 18 is located within an opening disposed in housing 12 of device, and is coupled to housing 12 by means of flexible membrane 25 disposed on the lower surface of tiltable member 18. Below membrane 25 is disposed electrically conductive member 22. Although not illustrated, an optional light guide layer of conventional construction may also be included, as discussed above.

Figure 8:
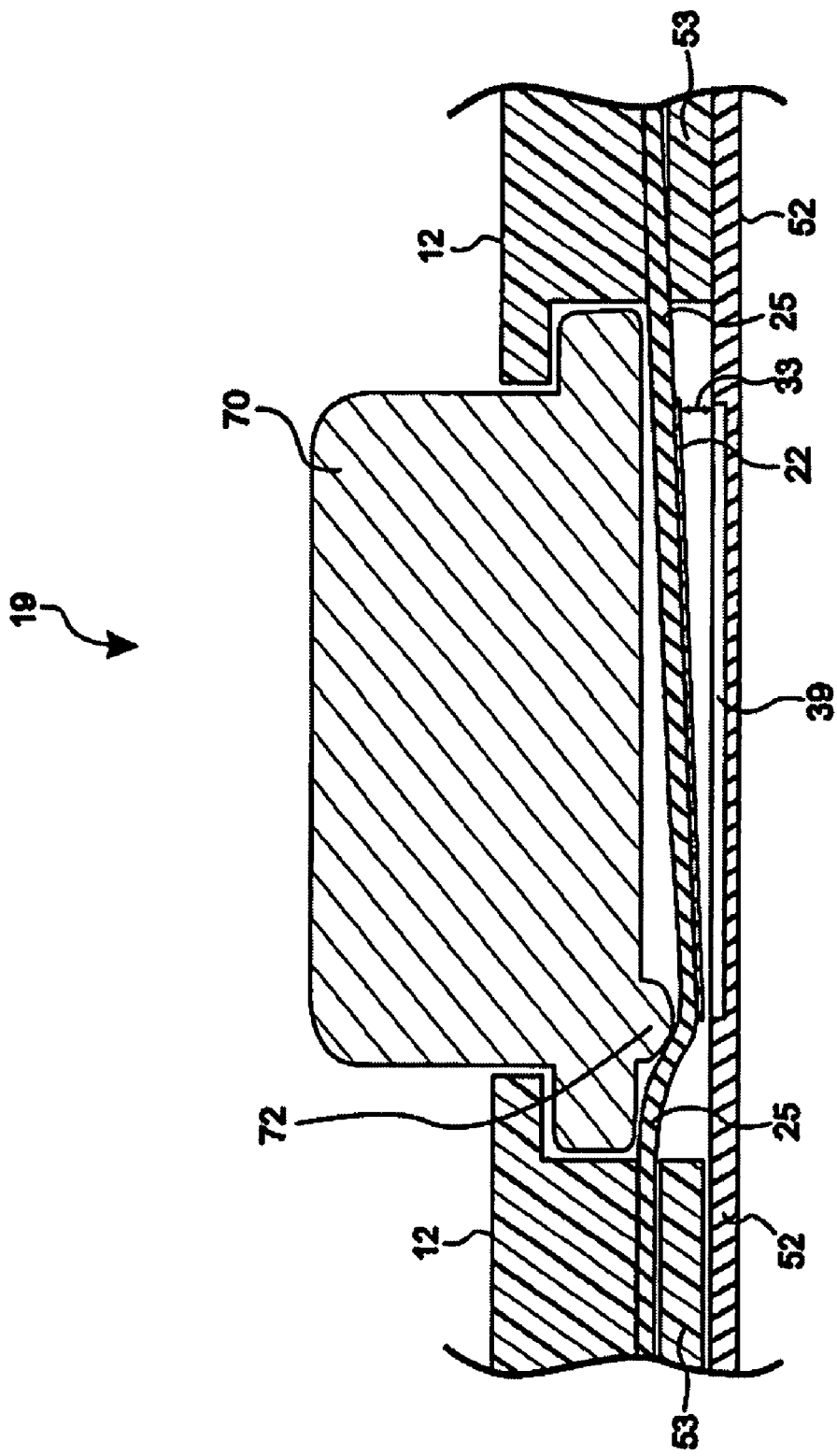
FIG. 8 is a cross-sectional view of still another embodiment employing a rotatable knob having a tilted lower surface, with a protrusion extending downwardly therefrom, where rotation of the knob varies the tilt of an underlying electrically conductive member or plate in respect of the electrode array.

Shaft 74 extending downwardly from knob 70 through tiltable member 18 for mounting of the lower portion thereof to bearing 76 mounted on or near substrate 52. Knob 70 is provided with a downwardly extending bump or protrusion 72, which is configured to slidably engage tiltable member 18 and tilt the engaged portion thereof downwardly towards peripheral electrodes 40, 41, 44 and 45 disposed on substrate 52 to allow sensing and measurement of the resultant changes in capacitance between electrically conductive member 22 and peripheral electrodes 40, 41, 44 and 45 disposed on substrate 52. Member 22 is provided with a downwardly extending member 30, similar to member 30 illustrated in FIGS. 2 and 6. Downwardly extending member 30 in turn is provided with coupling electrode 32, which is electrically coupled to drive electrode 42 disposed on substrate 52, thereby allowing detection of capacitance changes by capacitance sensing circuitry 104 as described above. Embodiments incorporating both knob 70 and switches 34, 35, 37 and 38 are also contemplated FIG. 8 is a cross-sectional view of still another embodiment employing rotatable knob 70 having tiltable electrically conductive member 22 disposed therebelow beneath flexible membrane 25. Protrusion 72 extends downwardly from rotatable knob 70 and deflects flexible membrane 25 into proximity with electrode array 39 disposed therebelow. Rotation of knob 70 varies the location at which underlying electrically conductive member 22 is in proximity to one of sense electrodes 40, 41, 44 or 45 of electrode array 39, which in the embodiment illustrated in FIG. 8 contains no dome switches.

Figure 9:
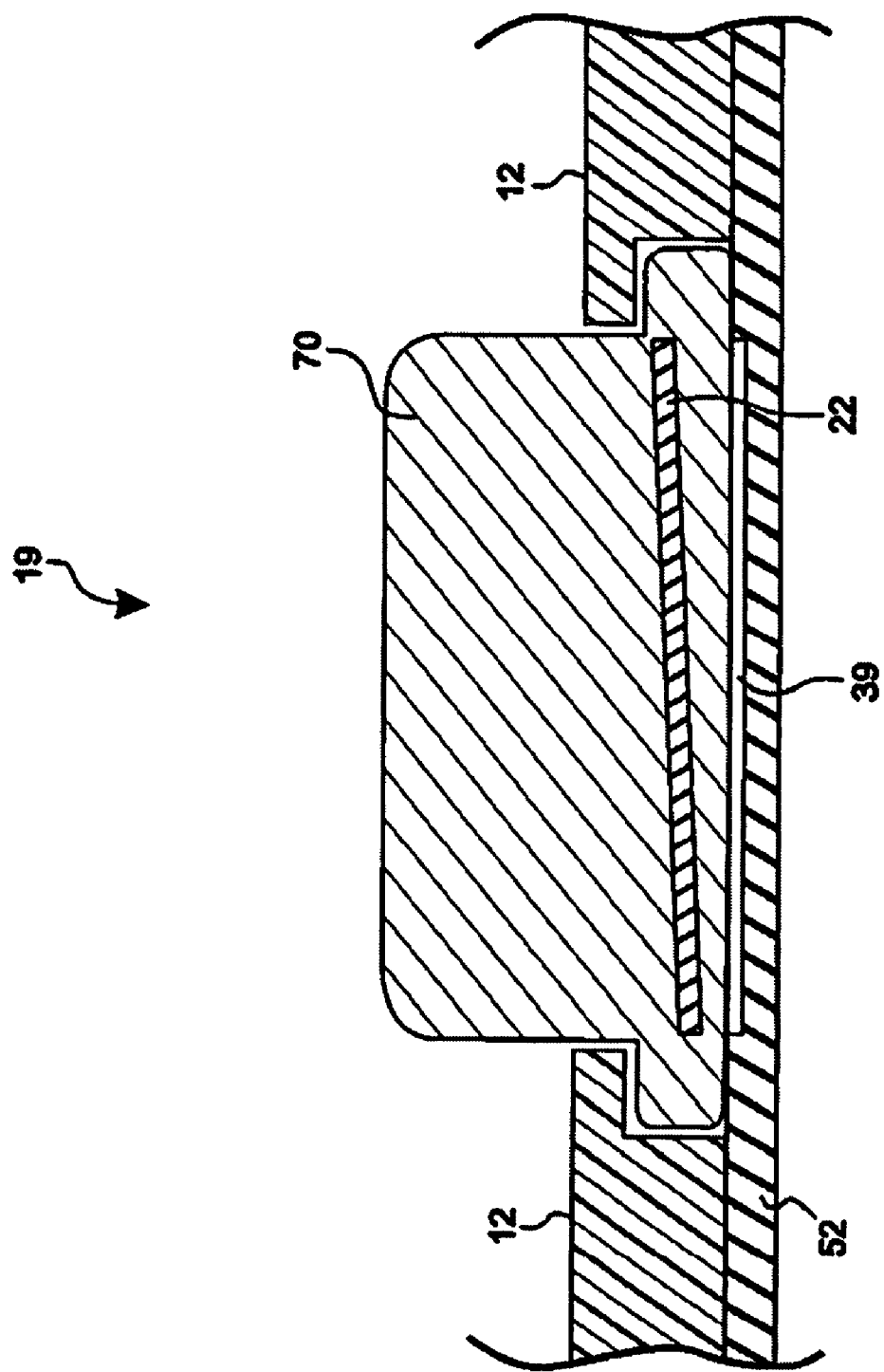
FIG. 9 is a cross-sectional view of a further embodiment employing a rotatable knob having a tilted electrically conductive member disposed therewith, where rotation of the knob varies the position of the tilted member in respect of the underlying electrode array.

FIG. 9 is a cross-sectional view of a further embodiment employing rotatable knob 70 having tilted electrically conductive member 22 disposed therewithin, where rotation of knob 70 varies the position of tilted member 22 in respect of underlying electrode array 39, which like the embodiment illustrated in FIG. 8 has no dome switches mounted therein.

The embodiments described above in connection with FIGS. 1-9 rely on the principle of mutual capacitance, as discussed hereinabove in greater detail. In other embodiments, the principle of self-capacitance is employed in control and data entry apparatus 19, where, for example, drive electrode 42 in the foregoing embodiments is replaced with electrode 43 (not shown in the Figures) connected electrically to ground, and electrically conductive member 22 having a drive signal applied thereto is replaced with electrically conductive ground member 23 (not shown in the Figures) also connected electrically to ground. Each of electrodes 40, 41, 44 and 45 in such an embodiment would therefore provide increased current flow as tiltable member 18 is moved in proximity thereto, as a closer path to ground is provided thereby. The functionality provided by such self-capacitance embodiments is substantially similar to that provided by the mutual capacitance embodiments described hereinabove, except that the sensing of clicks by means of dome switches 34, 35, 36, 37 and 38 may be provided by positioning a ground pad in the center of dome 36. When a given dome is collapsed, a strong path to ground is provided to the self-capacitance electrode, thereby causing increased current flow which exceeds that caused by merely tilting member 22 toward a given electrode, thereby allowing capacitance sensing circuitry 104 to distinguish between a shallow tilt for scrolling and a deep tilt for clicking.

Figure 10:
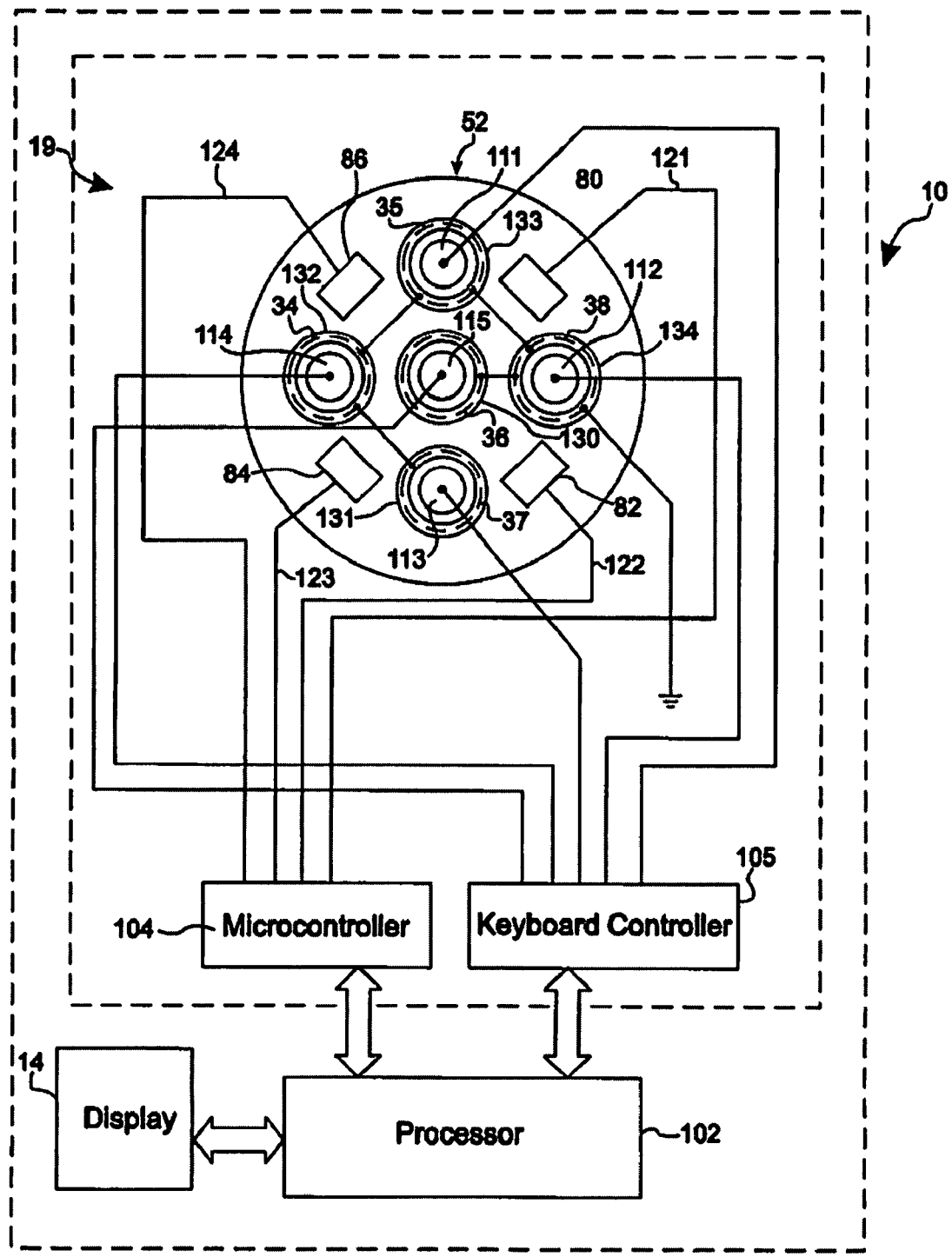
FIG. 10 illustrates one embodiment of an electrode and switch array and its connection to Hall effect sensing circuitry, a host processor and a display.

FIG. 10 illustrates yet another embodiment, where Hall effect sensors are employed to sense finger movement instead of capacitive sensing technology. In a Hall effect sensor, the output voltage provided thereby varies in response to changes in the local magnetic field. As illustrated in FIG. 10, in one embodiment Hall effect sensors 80, 82, 84 and 86 are disposed at 45, 135, 215 and 305 degree positions beneath tiltable member 18 and are configured to effect scrolling functionality. Tiltable member 18 includes four suitable corresponding permanent magnets positioned directly above each of the four Hall effect sensors, with each such magnet being capable of magnetically coupling with a corresponding Hall effect sensor disposed therebeneath when tiltable member 18 is pressed slightly downwardly by a user's finger into proximity therewith.

Hall effect sensors 80, 82, 84 and 86 are preferably configured to provide output signals indicative of tiltable member 18 being pressed into proximity thereto, where such output signals are provided to microcontroller 105 via communication lines, busses or conductors 121, 122, 123 and 124. In a preferred embodiment, microcontroller 105 includes software code especially designed to process output voltage signals provided by Hall effect sensors 80, 82, 84 and 86 and provide output signals indicative of scrolling to host processor 102. Hall effect sensors 80, 82, 84 and 86 and microcontroller 105 may be configured to determine which among sensors 80, 82, 84 and 86 is closest to the underside of tiltable member 18 having permanent magnets disposed thereon on the basis of, for example, maximum sensed magnetic flux.

Contact pairs 133/111, 134/112, 131/113, 132/114 and 130/115 are disposed below corresponding dome switches 35, 38, 37, 34 and 36, respectively (the outer edges of which are denoted by dashed lines in FIG. 10), and permit actuation of such switches through such pairs to effect clicking functionality. Unlike other embodiments disclosed hereinabove, however, switches 34-38 in FIG. 10 and the corresponding contacts disposed therebelow are arranged in a conventional configuration where contacts do not provide dual functionality as both switch contacts and electrodes, but instead function conventionally as switch contacts. Switches 34-38 are operably connected to keyboard controller 105, which in turn is operably connected to host processor 102. In the simplest case, the central, inner, disk-shaped pad disposed beneath each dome switch is tied to a corresponding pin on keypad controller 105, and the outer ring surrounding each such pad is tied to ground. Keypad controller 105 drives each pin and is configured to sense dome collapse when a given pin becomes tied to ground through a dome switch being collapsed onto its corresponding ground pad.

In one embodiment, permanent magnets disposed above Hall effect sensors 80, 82, 84 and 86 are embedded within tiltable member 18 at 45, 135, 215 and 305 degree positions corresponding to the orientations and positions of sensors 80, 82, 84 and 86 positioned directly therebelow, but may also assume any of a number of other configurations, such as discrete permanent magnets embedded in or attached to the underside of flexible member 25, strips or circles formed of a ferromagnetic material, a ferromagnetic coating, a magnetic epoxy, a magnetic adhesive, a magnetic polymer, a magnetic paint or a magnetic coating disposed on the underside, within or atop tiltable member 18, and the like.

In still another embodiment, electrical resistivity, as opposed to capacitance or magnetism, is employed to provide scrolling functionality in control and data entry apparatus 19. In such an embodiment, the electrical resistivities of a series of sub-circuits disposed on a substrate in positions on substrate 52 corresponding roughly to those occupied by sense electrodes 40, 41, 44 and 45 in FIGS. 2, 3C and 5 change in response to compression of a carbon-filled elastomer caused by the proximity of tiltable member 18 being positioned immediately thereabove and in contact therewith. Electrically conductive contacts disposed on the underside of tiltable member 18 are employed to engage portions of such sub-circuits when tiltable member 18 is pressed downwardly thereupon and in contact therewith, thereby changing the electrical resistance of the sub-circuit which has been pressed downwardly upon. A suitable resistance sensing circuit may be employed to sense such changes in resistance corresponding to the position and tilt of tiltable member 18 and report such changes to host processor 102.

While the primary use of the control and data entry apparatus of the invention is believed likely to be in the context of relatively small portable devices, it may also be of value in the context of larger devices, including, for example, keyboards associated with desktop computers or other less portable devices such as exercise equipment, industrial controls, industrial control panels, washing machines, control panels, outdoor control devices, or equipment or devices configured for use in moist, humid, sea-air, muddy or underwater environments. Similarly, while many embodiments of the invention are believed most likely to be configured for manipulation by a users fingers, some embodiments may also be configured for manipulation by other mechanisms or body parts. For example, the invention might be located on or in the hand rest of a keyboard and engaged by the heel of the user's hand.

Note that the term "control and data entry apparatus" as it appears in the specification and claims hereof is not intended to be construed or interpreted as being limited solely to a device or component of a device capable of effecting both control and data entry functions, but instead is to be interpreted as applying to a device capable of effecting either such function, or both such functions.

Note further that included within the scope of the invention are methods of making and having made the various components, devices and systems described herein.

The above-described embodiments should be considered as examples of the present invention, rather than as limiting the scope of the invention. In addition to the foregoing embodiments of the invention, review of the detailed description and accompanying drawings will show that there are other embodiments of the present invention. Accordingly, many combinations, permutations, variations and modifications of the foregoing embodiments of the present invention not set forth explicitly herein will nevertheless fall within the scope of the present invention.

We claim:

1. A mutual capacitance control and data entry apparatus, comprising:
    a tiltable member configured for tilting by a user or a mechanism;
    an electrically conductive member attached to the tiltable member;
    a substrate spaced apart from the electrically conductive member by a gap and having a plurality of mutually isolated electrically conductive sense electrodes disposed thereon;
    a drive signal circuit configured to provide an electrical drive signal to the electrically conductive member and operably connected thereto;
    a capacitance measurement circuit operably coupled to the electrically conductive member and the sense electrodes, the circuit being configured to detect changes in capacitance occurring between the electrically conductive member and the sense electrodes when the tiltable member is tilted towards the sense electrodes, and
    a plurality of switches, each such switch being operably connected to a corresponding one of the plurality of sense electrodes and being configured to connect such sense electrode to ground upon being actuated or closed by a user;
    wherein tilting of the tiltable member by the user or the mechanism effects a first function in the device, and closing of one of the plurality of switches by the user effects a second function in the device.

2. The control and data entry apparatus of claim 1, wherein the first function is scrolling and the second function is clicking.

3. The control and data entry apparatus of claim 1, wherein the plurality of switches are dome switches.

4. The control and data entry apparatus of claim 1, further comprising a flexible membrane interposed between the tiltable member and the electrically conductive member.

5. The control and data entry apparatus of claim 1, wherein the plurality of sense electrodes provide output signals indicative of corresponding overlying navigation sectors located on or in the tiltable member that are tilted by the user or mechanism into proximity with the sense electrodes.

6. The control and data entry apparatus of claim 1, wherein the apparatus is configured to effect the first function when the tiltable member is tilted slightly and to effect the second function when the tiltable member is tilted deeply.

7. The control and data entry apparatus of claim 6, wherein tilted slightly corresponds to a first vertical displacement of the tiltable member ranging between about 0.25 mm and about 0.40 mm, between about 0.20 mm and about 0.45 mm and between about 0.15 mm and about 0.50 mm, and tilted deeply corresponds to a second vertical displacement of the tiltable member ranging between about 0.45 mm and about 0.65 mm, between about 0.40 mm and about 0.70 mm and between about 0.30 mm and about 0.80 mm.

8. The control and data entry apparatus of claim 1, wherein an outer periphery of the tiltable member is configured to tilt through a maximum vertical distance of about 0.10 mm, about 0.20 mm, about 0.30 mm, about 0.40 mm, about 0.50 mm, about 0.60 mm and about 0.70 mm, or to tilt through a vertical distance ranging between about between about 0.20 mm and about 0.40 mm, between about 0.10 mm and about 0.60 mm, and about 0.05 mm and about 0.80 mm.

9. The control and data entry apparatus of claim 1, wherein the electrically conductive member is substantially planar in shape and has a diameter approximating between about 10 mm and about 50 mm or at least one of about 12 mm, about 14 mm, about 16 mm, about 18 mm, about 20 mm, about 30 mm and about 40 mm.

10. The control and data entry apparatus of claim 1, wherein the apparatus is a 5-way keypad.

11. The control and data entry apparatus of claim 1, wherein the tiltable member comprises a generally circular shape forming an outer ring and the apparatus comprises a center button disposed within the outer ring, the outer ring having markings corresponding to cardinal directions superimposed thereon.

12. The control and data entry apparatus of claim 1, wherein the tiltable member and the apparatus are configured to control a position of a cursor, the cursor moving in a direction of tilt of the tiltable member, such movement being proportional to the degree of the tilt.

13. The control and data entry apparatus of claim 1, wherein the apparatus is configured such that substantially no path to ground is established by the user placing a finger on the apparatus.

14. The control and data entry apparatus of claim 1, further comprising a flexible membrane, the membrane being configured to impart at least one of leak-tightness, leak resistance, gas-tightness, gas resistance, vapor-tightness and vapor resistance to the device.

15. The control and data entry apparatus of claim 1, wherein the capacitance measurement circuit is operably connected to a host processor.

16. The control and data entry apparatus of claim 1, wherein the apparatus is incorporated into and forms a portion of a mobile electronic device.

17. The control and data entry apparatus of claim 16, wherein the mobile electronic device is at least one of a laptop computer, personal data assistant (PDA), a mobile telephone, a cellular telephone, a radio, an MP3 player, and a portable music player.

18. The control and data entry apparatus of claim 1, wherein the apparatus is incorporated into and forms a portion of a stationary device, the stationary device being one of an exercise machine, an industrial control, a control panel, an outdoor control device, and a washing machine.

19. The control and data entry apparatus of claim 1, wherein at least one of the drive signal circuit and the capacitance measurement circuit is incorporated into an integrated circuit.

20. The control and data entry apparatus of claim 1, wherein the apparatus is configured to effect the first function when tilting of the tiltable member by the user does not exceed a predetermined vertical displacement of the electrically conductive member.

21. The control and data entry apparatus of claim 1, wherein the apparatus is configured to effect a third function when tilting of the tiltable member by the user exceeds a predetermined vertical displacement of the electrically conductive member.

22. A Hall effect control and data entry apparatus, comprising:
a tiltable member configured for tilting by a user or a mechanism;
a plurality of magnets attached to, or disposed within or on, the tiltable member;
a substrate spaced apart from the plurality of magnets by a gap and having a plurality of Hall effect sensors disposed thereon, each Hall effect sensor being located beneath a corresponding magnet disposed thereabove;
a Hall effect sensing circuit or microcontroller operably coupled to each of the Hall effect sensors, the circuit or microcontroller and the Hall effect sensors being configured to detect changes in magnetism occurring between the Hall effect sensors and the magnets when the tiltable member is tilted towards the Hall effect sensors;
a keyboard controller, and
a plurality of switches disposed beneath the tiltable member and operably connected to the keyboard controller, each such switch being configured for closing by the tiltable member when the tiltable member is pressed downwardly thereupon;
wherein tilting of the tiltable member by the user or the mechanism effects a first function in the device, and closing of one of the plurality of switches by the user effects a second function in the device.

23. A method of making a mutual capacitance control and data entry apparatus, comprising:
providing a tiltable member configured for tilting by a user or a mechanism;
providing an electrically conductive member attached to the tiltable member;
providing a substrate spaced apart from the electrically conductive member by a gap and having a plurality of mutually isolated electrically conductive sense electrodes disposed thereon;
providing a drive signal circuit configured to provide an electrical drive signal to the electrically conductive member and operably connected thereto;

providing a capacitance measurement circuit operably coupled to the electrically conductive member and the sense electrodes, the circuit being configured to detect changes in capacitance occurring between the electrically conductive member and the sense electrodes when the tiltable member is tilted towards the sense electrodes, and providing a plurality of switches, each such switch being operably connected to a corresponding one of the plurality of sense electrodes and being configured to connect such sense electrode to ground upon being actuated or closed by a user;

wherein the resulting apparatus is configured such that tilting of the tiltable member by the user or the mechanism such effects a first function in the device, and closing of one of the plurality of switches by the user effects a second function in the device.

\* \* \* \* \*